(12) United States Patent
Niwa et al.

(10) Patent No.: US 8,110,325 B2
(45) Date of Patent: Feb. 7, 2012

(54) SUBSTRATE TREATMENT METHOD

(75) Inventors: Takafumi Niwa, Koshi (JP); Hiroshi Nakamura, Koshi (JP); Hideharu Kyouda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/022,811

(22) Filed: Feb. 8, 2011

(65) Prior Publication Data

US 2011/0200923 A1 Aug. 18, 2011

(30) Foreign Application Priority Data

Feb. 12, 2010 (JP) ................................. 2010-029338

(51) Int. Cl.
*G03F 9/00* (2006.01)
*G03C 5/00* (2006.01)

(52) U.S. Cl. .......... 430/30; 430/312; 430/328; 430/330; 430/394

(58) Field of Classification Search .................... 430/30, 430/312, 328, 330, 394
See application file for complete search history.

(56) References Cited

U.S. PATENT DOCUMENTS

| | | | | |
|---|---|---|---|---|
| 5,652,084 A | * | 7/1997 | Cleeves | 430/315 |
| 7,527,918 B2 | * | 5/2009 | Kondoh et al. | 430/312 |

FOREIGN PATENT DOCUMENTS

JP 7-147219 A 6/1995

* cited by examiner

*Primary Examiner* — Christopher Young
(74) *Attorney, Agent, or Firm* — The Nath Law Group; Jerald L. Meyer; Derek Richmond

(57) ABSTRACT

A substrate treatment method including a first treatment process (S13 to S16) for exposing, heating, and developing a substrate on which a first resist is formed, thereby forming a first resist pattern, and a second treatment process (S17 to S20) for forming a second resist film on the substrate on which the first resist pattern is formed, exposing, heating, and developing the substrate on which the second resist film is formed, thereby forming a second resist pattern. Also, the substrate treatment method compensates a first treatment condition in a first treatment process (S22 to S25) based on a measured value of a line width of the second resist pattern and a second treatment condition in a second treatment process (S26 to S29) based on a measured value of a line width of the first resist pattern.

7 Claims, 24 Drawing Sheets

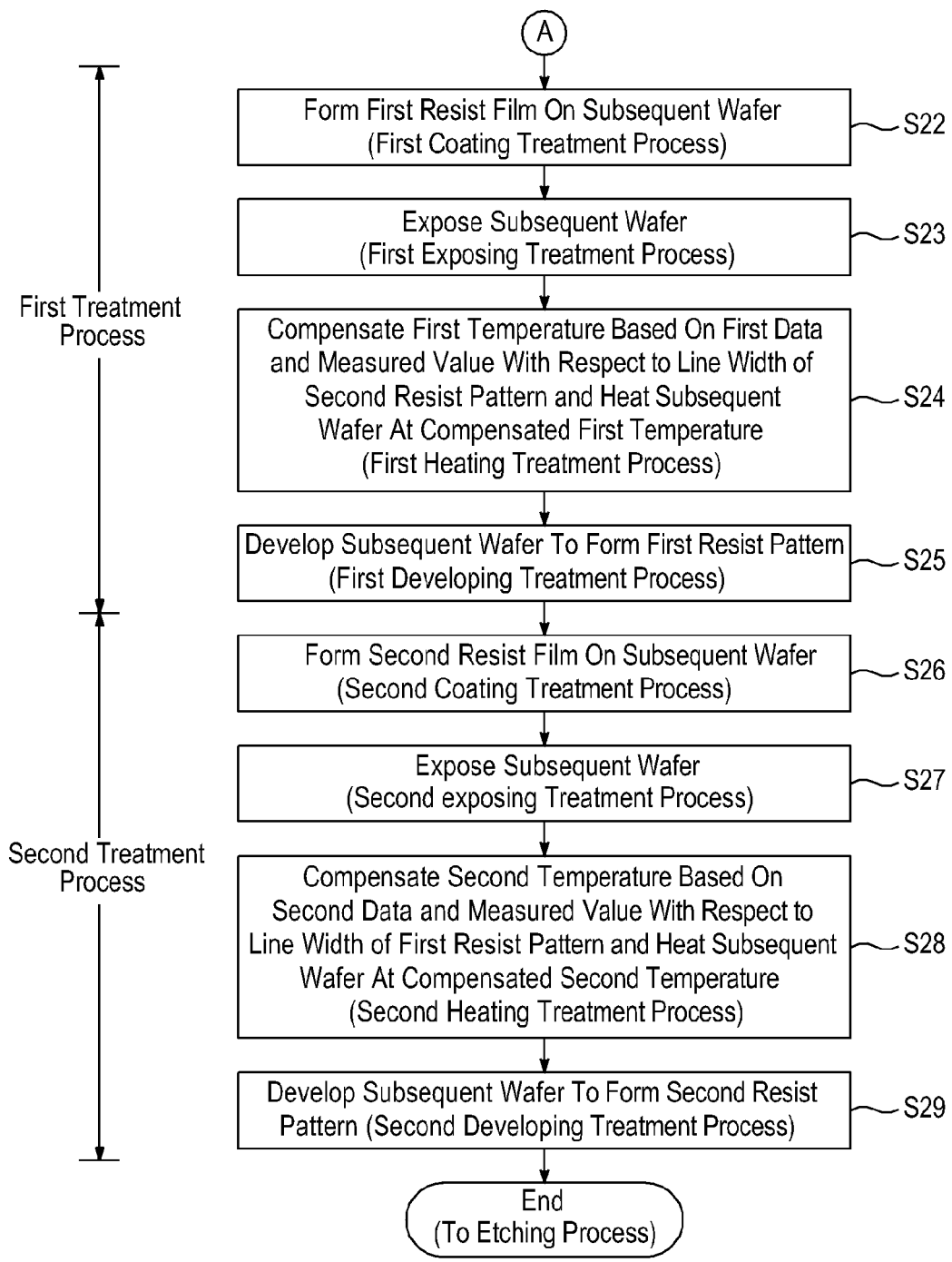

T=T2

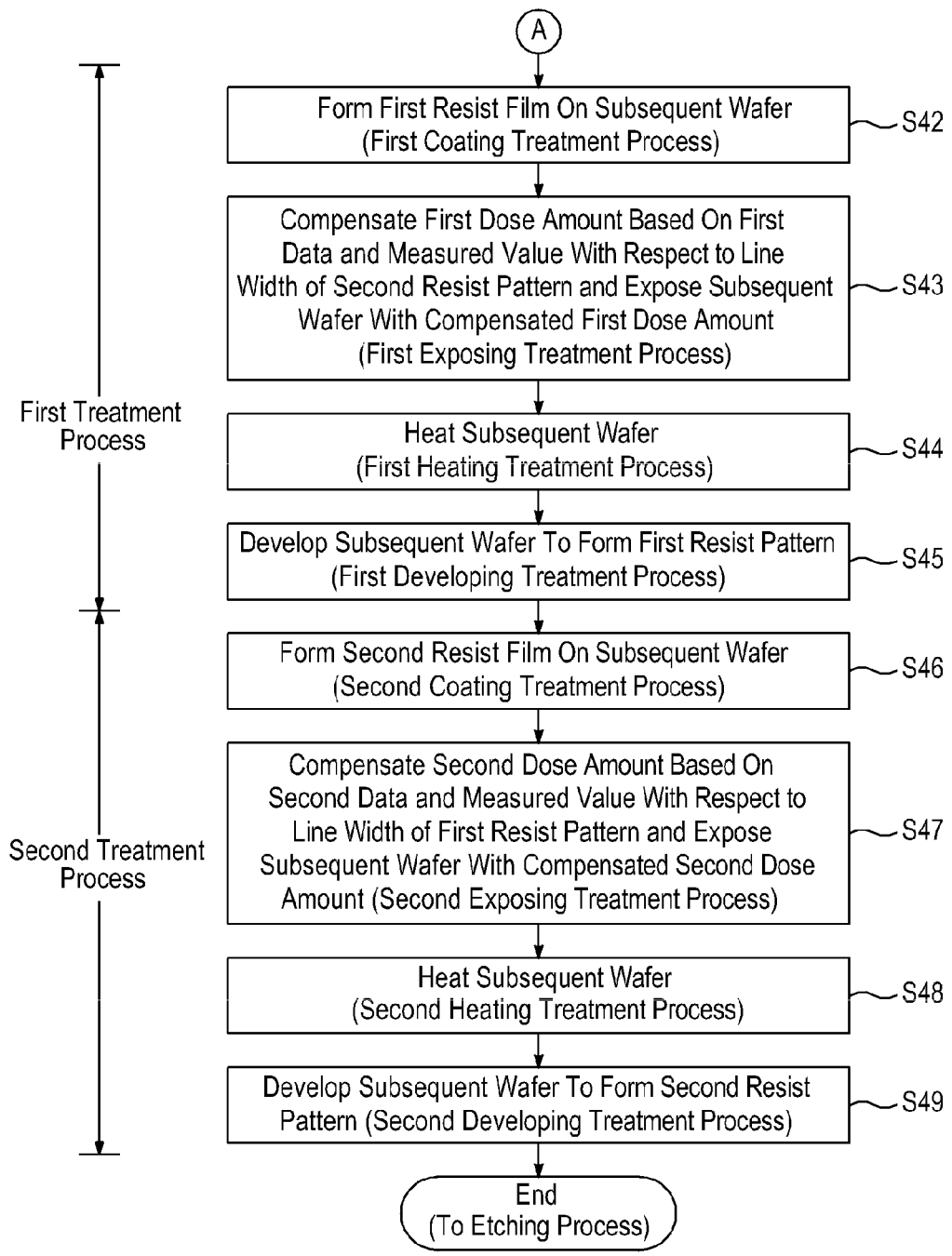

SUBSTRATE TREATMENT METHOD

CROSS-REFERENCE TO RELATED APPLICATIONS

This application is based upon and claims the benefit of priority from Japanese Patent Application No. 2010-029338, filed on Feb. 12, 2010, the entire contents of which are incorporated herein by reference.

TECHNICAL FIELD

Embodiments described herein relate generally to a substrate treatment method.

BACKGROUND

In manufacturing a semiconductor device, photolithography is used as a patterning technology for forming a circuit pattern on a semiconductor wafer (hereinafter, referred to as a wafer) that is a substrate to be processed. To form a circuit pattern, photolithography is used by applying a resist liquid on a wafer to form a resist film, irradiating a light, exposing the resist film so as to correspond to the circuit pattern, and developing the exposed resist film.

Recently, semiconductor devices have a high integration tendency in view of improving operation speed. As such, miniaturization of a circuit pattern to be formed on a wafer is required in a patterning technology using photolithography. For this purpose, processes to shorten a wavelength of light, which is used in an exposing process, have been developed, but these processes do not fully satisfy the requirements for an ultrafine semiconductor device lower than the 45 nm node.

Therefore, as patterning technologies capable of satisfying the requirements of the ultrafine semiconductor device lower than the 45 nm node, upon forming a pattern of one layer, technologies for performing a number of patterning processes through photolithography have been proposed (for example, See Japanese Laid-Open Patent Publication No. (Hei) 7-147219). Among those, a technology for performing a patterning process twice is referred to as double patterning.

Also, as one technology of double patterning, there is a lithography-lithography etching (LLE). In LLE, a first-time patterning process is performed to form a first-time resist pattern and a second-time patterning process is performed to form a second-time resist pattern, such that an etching process is performed by using the first-time and second-time resist patterns as masks.

However, when a pattern resist is formed through double patterning technology using the above mentioned LLE, there are problems as follows.

In a typical single patterning of performing a patterning process one time, it is required to control or compensate a treatment condition in the patterning process in order to reduce a variation between wafers or in surfaces of the wafers, each of which has a line width (e.g., CD: Critical Dimension) of a resist pattern that is formed through the patterning process.

On the other hand, in double patterning using LLE, a first-time patterning process is performed to form a first-time resist pattern (e.g., a first resist pattern) and then a second-time patterning process is performed to form a second-time resist pattern (e.g., a second resist pattern). A treatment condition in the first-time patterning process is required to be controlled or compensated so as to reduce a variation between wafers or in surfaces of the wafers, each of which has a line width (e.g., CD) of the first resist pattern. Also, a treatment condition in the second-time patterning process is required to be controlled or compensated so as to reduce a variation between the wafers or in the surfaces of the wafers, each of which has a line width (e.g., CD) of the second resist pattern.

However, for example, when the afore-mentioned ultrafine patterning lower than the 45 nm node is performed, it may be difficult to reduce a variation between wafers or in surfaces of the wafers, each of which has a line width (e.g., CD) of the first resist pattern only by controlling or compensating a treatment condition in a first-time patterning process. Also, it may be difficult to reduce a variation between the wafers or in the surfaces of the wafers, each of which has a line width (e.g., CD) of the second resist pattern only by controlling or compensating a treatment condition in the second-time patterning process.

SUMMARY

In accordance with one aspect of the present disclosure, double patterning is performed through a lithography-lithography etching (LLE) such that a variation in line widths of the first-time and second-time resist patterns is reduced between wafers and in surfaces of the wafers upon forming fine resist patterns.

In accordance with another aspect of the present disclosure, the following feature is provided.

According to one embodiment of the present disclosure, a method of processing a substrate is provided. The method includes a first treatment process for exposing an initial substrate on which a first resist film is formed, heating the exposed initial substrate, and developing the heated initial substrate, thereby forming a first resist pattern; and a second treatment process for forming a second resist film on the initial substrate on which the first resist pattern is formed, exposing the initial substrate on which the second resist film is formed, heating the exposed initial substrate, and developing the heated initial substrate, thereby forming a second resist pattern, wherein, after the second treatment process is performed on the initial substrate, a line width of the second resist pattern formed on the initial substrate is measured, a first treatment condition in the first treatment process is compensated based on a measured value of the line width of the second resist pattern, the first treatment process is performed on one of subsequent substrates in compliance with the compensated first treatment condition, a line width of the first resist pattern formed on the initial substrate is measured, a second treatment condition in the second treatment process is compensated based on a measured value of the line width of the first resist pattern, and the second treatment process is performed on the subsequent substrate in compliance with the compensated second treatment condition.

BRIEF DESCRIPTION OF THE DRAWINGS

FIGS. 7A and 7B are flow charts showing respective processes of a substrate treatment method in accordance with Embodiment 1 of the present disclosure.

FIGS. 11A and 11B are flow charts showing respective processes of a substrate treatment method in accordance with Embodiment 2 of the present disclosure.

DETAILED DESCRIPTION

Embodiments will now be described in detail with reference to the drawings.

Embodiment 1

With reference to FIGS. 1 to 10, a substrate treatment method and a substrate treatment system of performing the substrate treatment method according to Embodiment 1 are described.

Figure 1:
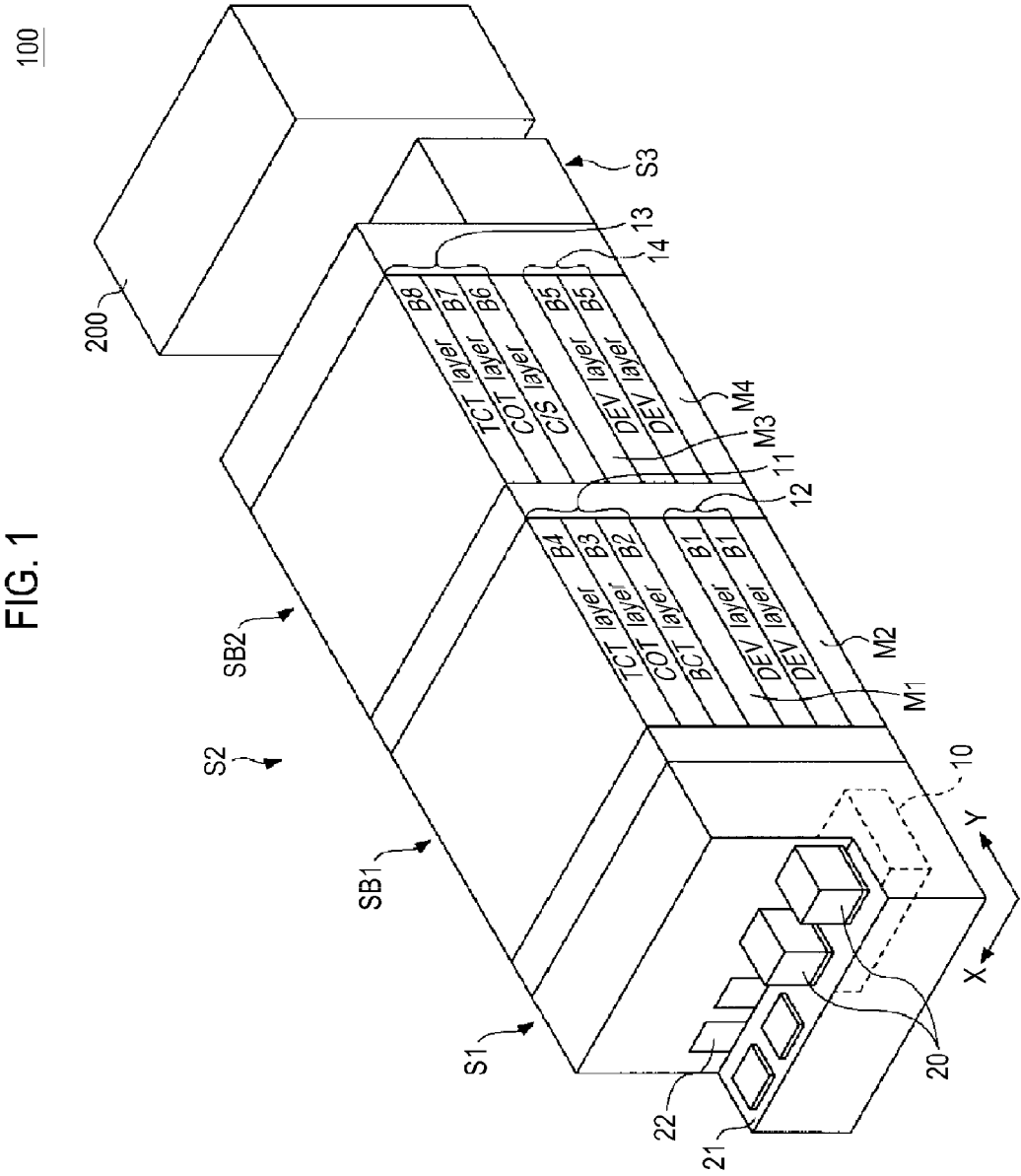
FIG. 1 is a schematic perspective view showing a configuration of a substrate treatment system in accordance with Embodiment 1 of the present disclosure.
Figure 2:
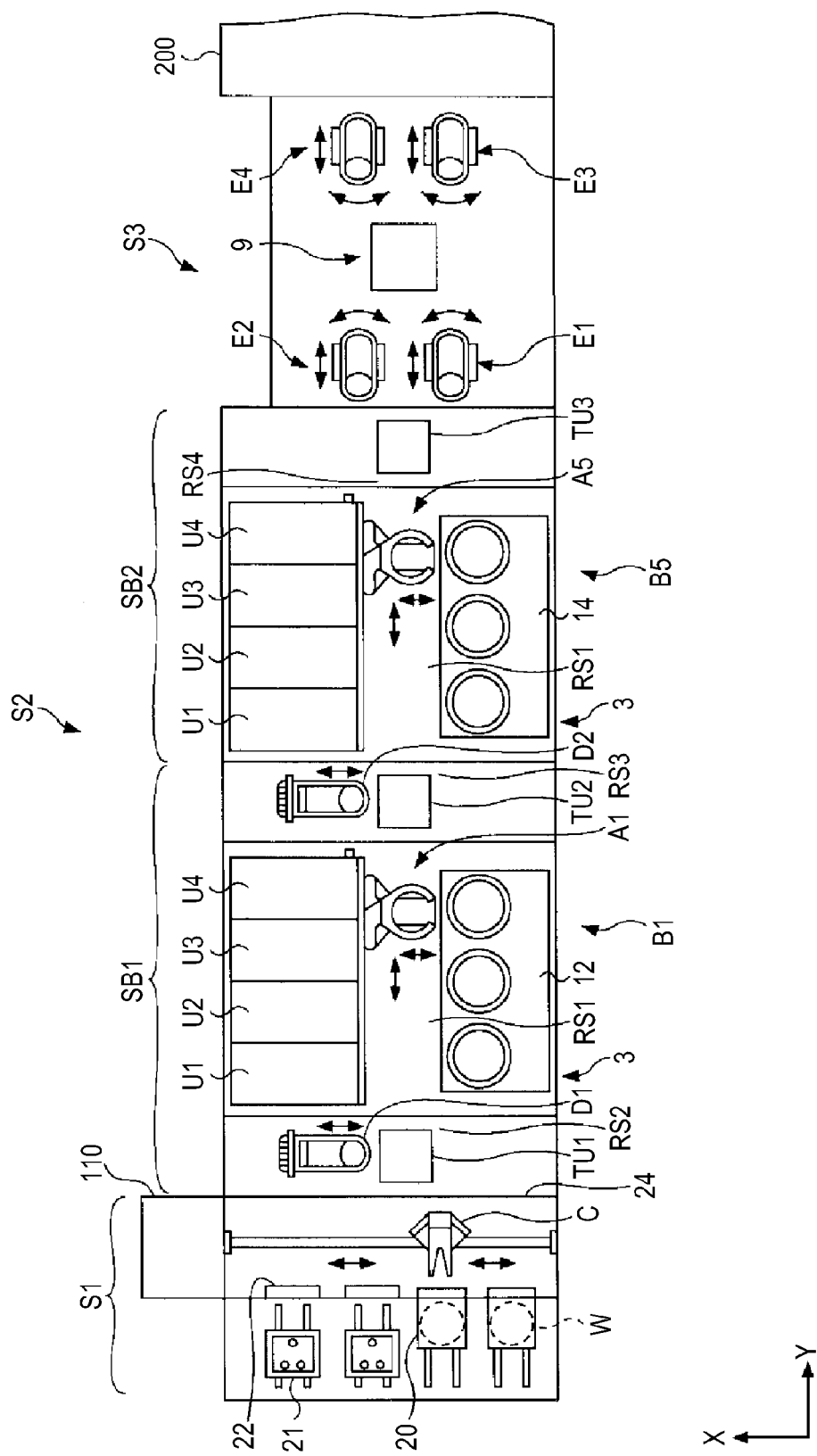
FIG. 2 is a schematic horizontal sectional view showing a part of a DEV layer of the substrate treatment system in accordance with Embodiment 1 of the present disclosure.

Initially, a substrate treatment system according to this embodiment will be described. FIG. 1 is a schematic perspective view showing a configuration of a substrate treatment system 100 according to this embodiment. FIG. 2 is a schematic horizontal sectional view showing a part of a DEV layer of the substrate treatment system 100 and FIG. 3 is a schematic lateral view showing the substrate treatment system 100.

The substrate treatment system 100 is configured to perform on a wafer W a coating treatment of a coating film including a photo resist and a developing treatment after an exposing treatment. The substrate treatment system 100 may correspond to double patterning or performing a patterning process twice. Also, the substrate treatment system 100 may be disposed in a clean room having an atmosphere of air. The substrate treatment system 100 includes a carrier block S1, a treatment block S2, and an interface block S3. The carrier block S1 is configured to take in and out a carrier 20 which accommodates a plurality of wafers W to be processed. The treatment block S2 is configured to perform a coating treatment on the wafer W to form a coating film including a photoresist film that serves as a photosensitive material and a developing treatment to develop a photoresist film that has been exposed through an exposure pattern. The substrate treatment system 100 may be used in a state where an exposing apparatus 200 is connected to the interface block S3.

As shown in FIG. 1, a main body control unit 10 that may control the entire operation of the substrate treatment system 100 is disposed at a lower portion of the carrier block S1. The main body control unit 10 will be described later in detail. Also, a control unit (not shown) is disposed in the exposing apparatus 200.

Figure 3:
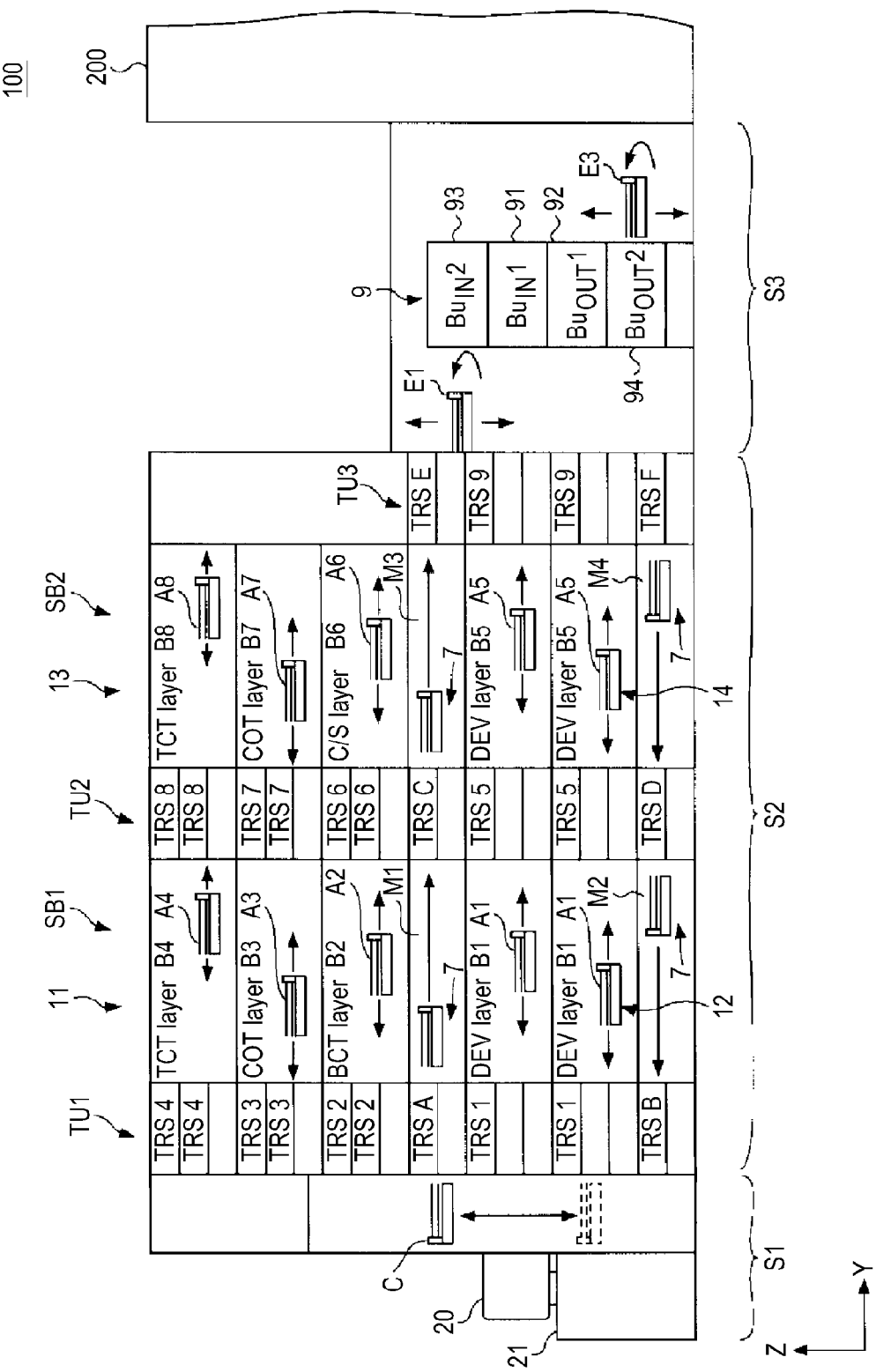
FIG. 3 is a schematic lateral view of the substrate treatment system in accordance with Embodiment 1 of the present disclosure.

In FIGS. 1 to 3, a width direction of the substrate treatment system 100 is in an X-direction, and an arrangement direction of the carrier block S1, the treatment block S2 and the interface block S3, which are perpendicular to the X-direction, is in a Y-direction. Further, a vertical direction with respect to the X-direction is in a Z-direction.

In the carrier block S1, a mounting table 21 capable of mounting a plurality of carriers 20, an opening/closing unit 22 arranged on a front wall from the mounting table 21, and a transfer arm C for taking out the wafer W from the carrier 20 through the opening/closing unit 22 are disposed. The transfer arm C is configured to be extendable, retractable, elevatable, descendible, rotatable around a vertical axis, and movable in an arrangement direction of the carriers 20.

Further, as shown in FIG. 2, for example, a line width measuring apparatus 110 for measuring a line width of a resist pattern on the wafer W is disposed at the carrier block S1.

The treatment block S2 is enclosed by a housing 24 and connected to the carrier block S1. The treatment block S2 includes first and second sub-blocks SB1 and SB2 which are made of a plurality of treatment layers that are stacked and arranged in parallel in the Y-direction.

In the first sub-block SB1, a second developing treatment unit 12 for performing a second-time developing treatment is arranged on a bottom side, and a first coating treatment unit 11 for performing a first-time coating treatment is arranged over the second developing treatment unit 12. The second developing treatment unit 12 is configured with two developing treatment layers B1 (e.g., DEV layers) which have the same structure as each other and are stacked in a vertical direction. The first coating treatment unit 11 is configured with a bottom anti-reflective coating treatment layer B2 (e.g., a BCT layer), a resist coating treatment layer B3 (e.g., a COT layer), and a top anti-reflective coating treatment layer B4 (e.g., a TCT layer), which are stacked in turn from a bottom side. The bottom anti-reflective coating treatment layer B2 (e.g., the BCT layer) is configured to perform a coating treatment of a bottom anti-reflective coating (BARC) film that is formed on a bottom layer of a resist film. The resist coating treatment layer B3 (e.g., the COT layer) is configured to perform a coating treatment of a resist liquid. The top anti-reflective coating treatment layer B4 (e.g., the TCT layer) is configured to perform a coating treatment of a top anti-reflective coating (TARC) film that is formed on a top layer of the resist film. The first sub-block SB1 further includes a first transfer layer M1 between the second developing treatment unit 12 and the first coating treatment unit 11, and a second transfer layer M2 at a lowermost stage.

In the sub-block SB2, a first developing treatment unit 14 for performing a first-time developing treatment is arranged on a bottom side, and a second coating treatment unit 13 for performing a second-time coating treatment is arranged over the first developing treatment unit 14. The first developing treatment unit 14 is configured with two developing treatment layers B5 (e.g., DEV layers) which have the same structure as each other and are stacked in a vertical direction. The DEV layers B5 have the same structure as those in the DEV layers B1. The second coating treatment unit 13 is configured with a cleaning/surface treatment layer B6 (e.g., a C/S layer), a resist coating treatment layer B7 (e.g., a COT layer), and a top anti-reflective coating treatment layer B8 (e.g., a TCT layer), which are stacked in turn from a bottom side. The cleaning/surface treatment layer B6 (e.g., the C/S layer) is configured to perform a cleaning treatment and/or a surface treatment, e.g., a cure treatment, of a TARC film. The cleaning/surface treatment layer B6 (e.g., the C/S layer) is disposed so as to prevent a coating treatment from being performed while particles are attached to a surface of a TARC film, or a leaching from occurring, when a second-time treatment is performed on the TARC film that is a top film upon performing the first-time coating treatment. The resist coating treatment layer B7 (e.g., the COT layer) is configured to perform a coating treatment using a resist liquid. The top anti-reflective coating treatment layer B8 (e.g., the TCT layer) is configured to perform a coating treatment for an antireflection film that is formed on a top layer of a resist film. The second sub-block SB2 further includes a third transfer layer M3 between the first developing treatment unit 14 and the second coating treatment unit 13, and a fourth transfer layer M4 at a lowermost stage. Also, the respective layers of the first and second sub-blocks SB 1 and SB 2 are partitioned by partition plates (e.g., base bodies).

The treatment block S2 includes a first transfer rack unit TU1 at a side of the carrier block 51. The first transfer rack unit TU1 is configured with a plurality of transfer stages which are stacked in a vertical direction along the treatment layers B1 to B4 and the transfer layers M1 and M2. Also, the treatment block S2 includes a second transfer rack unit TU2 which is provided between the first sub-block SB 1 and the second sub-block SB2. The second transfer rack unit TU2 is configured with a multiplicity of transfer stages which are stacked in a vertical direction along the treatment layers B1 to B4 and the transfer layers M1 and M2, and the treatment layers B5 to B8 and the transfer layers M3 and M4. The treatment block S2 further includes a third transfer rack unit TU3 at a side of the interface block S3. The third transfer rack unit TU3 is configured with a number of transfer stages which are stacked in a vertical direction along the treatment layers B5 to B8 and the transfer layers M3 and M4.

Figure 4:
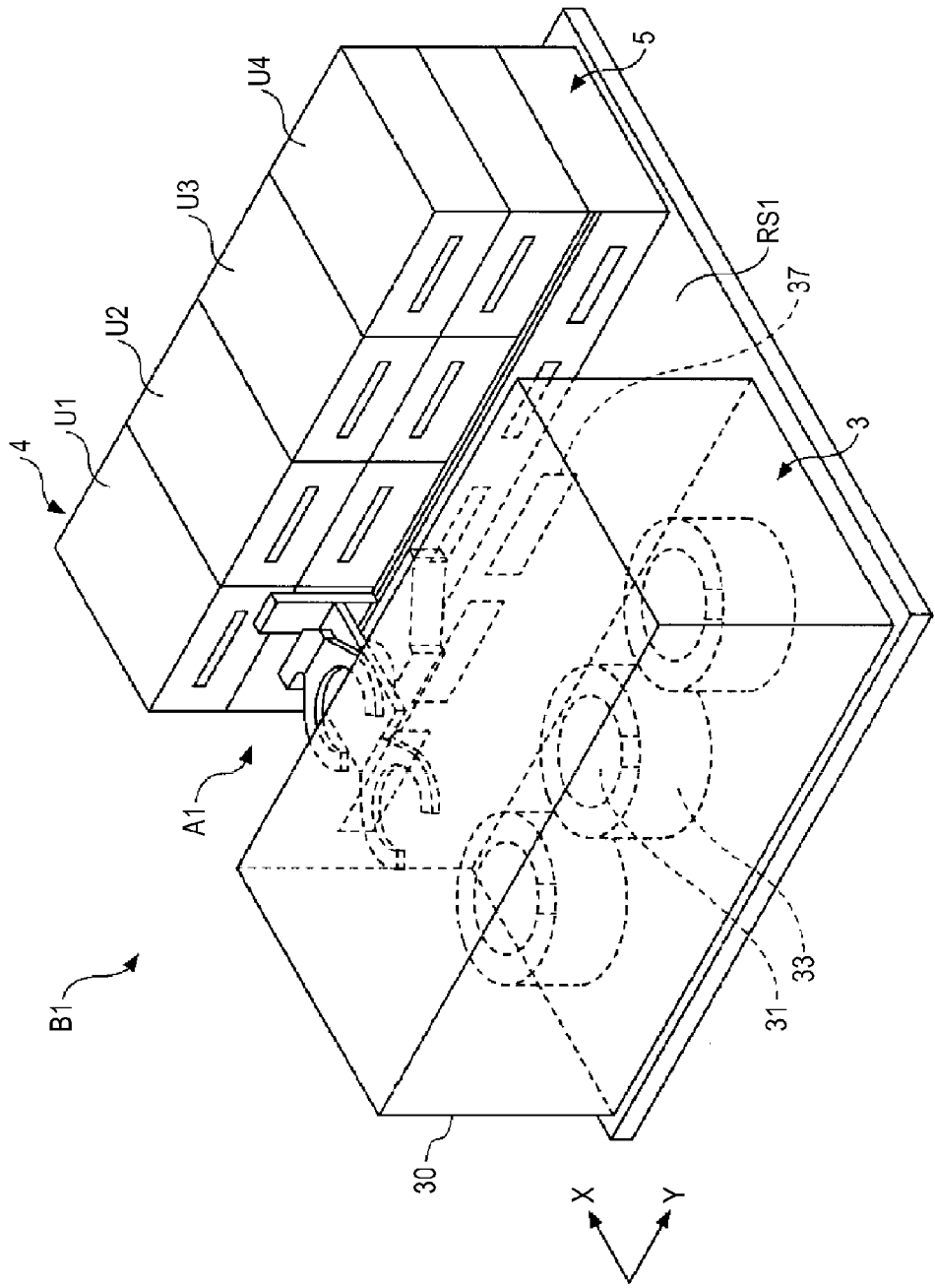
FIG. 4 is a perspective view showing a layout of the DEV layer.
Figure 5:
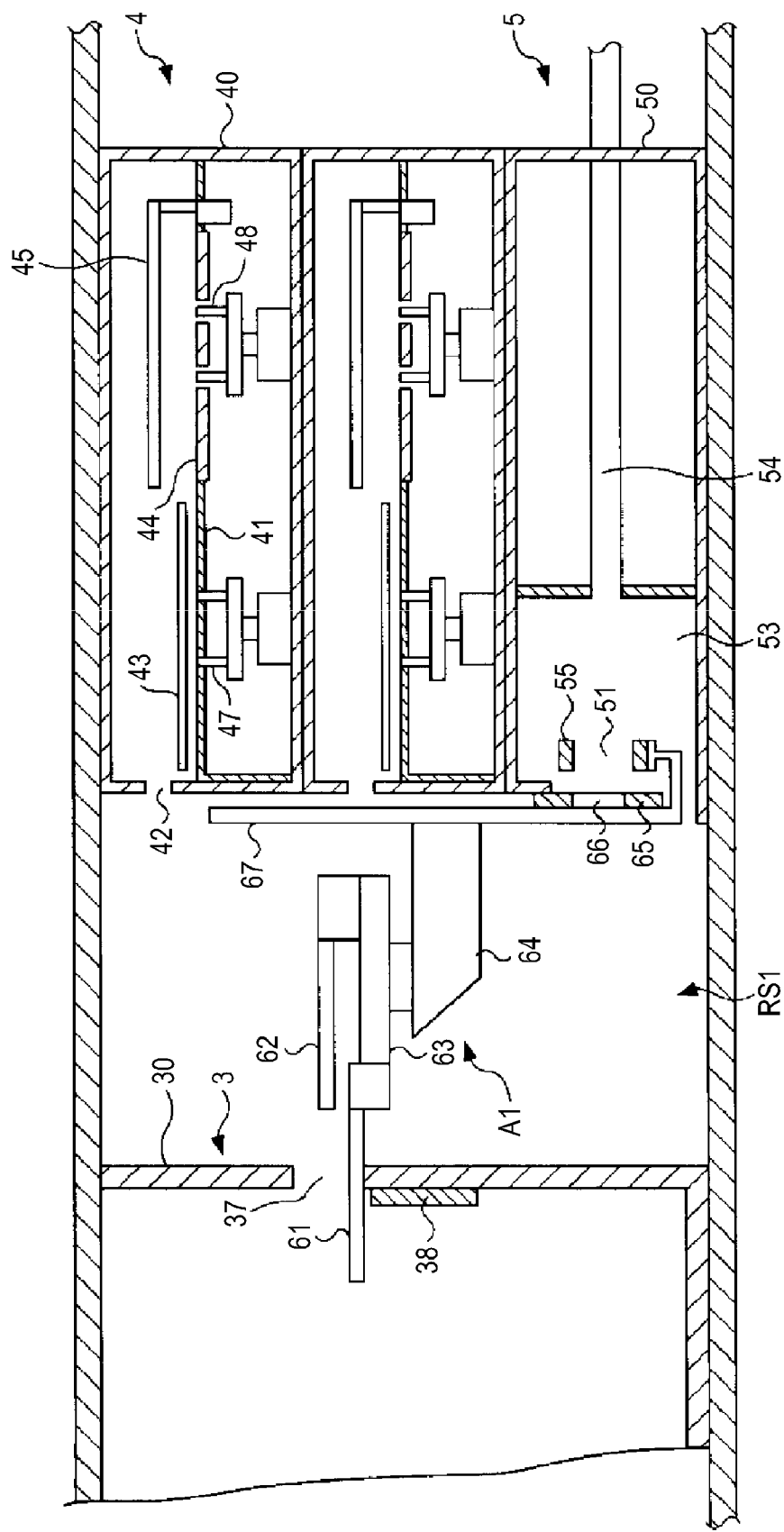
FIG. 5 is a vertical sectional view showing a heating unit and a main arm of the DEV layer.

Next, with reference to FIGS. 2, 4, and 5, configurations of the treatment layers B1 to B8 and the transfer layers M1 to M4 will be described. FIG. 4 is a perspective view showing a layout of the DEV layer. FIG. 5 is a vertical sectional view showing a heating unit and a main arm of the DEV layer.

Common parts are largely included in the treatment layers B1 to B8 which are configured in an approximate identical layout. Therefore, the DEV layer B1 will be described as a representative embodiment.

As shown in FIGS. 2 and 4, a transfer passage RS1 is disposed at a center portion of the DEV layer B1. A main transfer arm A1 (e.g., a main arm) for transferring the wafer W along the Y-direction moves on the transfer passage RS1. On one side of the transfer passage RS1, a developing treatment unit 3 serving as a liquid treatment unit for performing a developing treatment is disposed along the transfer passage RS1. Also, on the other side of the transfer passage RS1, four rack units U1, U2, U3, and U4 that are formed by combining a treatment unit for heating and cooling, and an exhaust unit 5; and disposing them along the transfer passage RS1. Therefore, the developing treatment unit 3 and the rack units U1 to U4 are disposed to face each other while having the transfer passage RS1 therebetween.

The developing treatment unit 3 includes a housing 30 and a spin chuck 31, e.g., three spin chucks, serving as a wafer holding support unit is arranged in the housing 30. The spin chuck 31 is configured to be rotatable or movable up and down around a vertical axis by a driving unit that is not shown. Also, a cup 33 is disposed around the spin chuck 31.

In the developing treatment unit 3, the wafer W is carried in the housing 30 by the main arm A1 through a transfer hole 37 that is disposed to face the transfer passage RS1, thereby being transferred to the spin chuck 31. As shown in FIG. 5, the transfer hole 37 is capable of being opened and closed by a shutter 38. Upon transferring the wafer W to the spin chuck 31, in the developing treatment unit 3, a developing solution is supplied from a nozzle, which is not shown, to a surface of the wafer W, thereby forming a liquid film of the developing solution on the surface of the wafer W. Afterwards, the developing solution on the surface of the wafer W is cleaned by a cleaning solution from a cleaning solution supply device which is not shown, and then the wafer W is rotated and dried, thereby terminating the developing treatment.

A heat-series treatment unit for performing a pre-treatment and a post-treatment, which are to be performed in the developing unit 3, is stacked in two stages in the respective rack units U1 to U4. Also, an exhaust unit 5 is disposed at a bottom portion of the respective rack units U1 to U4. In the heat-series treatment unit, for example, a heating treatment unit 4 of heating the wafer W after exposure or drying the same after development, or a cooling unit of controlling the wafer W after the treatment in the heating treatment unit 4 to a predetermined temperature may be included. In particular, in the DEV layer B1, the heating treatment unit 4 is stacked in two stages in the respective rack units U1, U2, and U3, and the cooling treatment unit is stacked in two stages in the rack unit U4.

As shown in FIG. 5, the heating treatment unit 4 includes a housing 40 and a base 41 is disposed in the housing 40. A transfer hole 42 for the wafer W is formed on a portion of the housing 40, which faces the transfer passage RS1. In the housing 40, a cooling plate 43 for primary heat removal and a hot plate 44 are disposed. The cooling plate 43 is configured to be movable between a cooling position shown in FIG. 5 and a transfer position on the hot plate 44. A reference numeral 45 of FIG. 5 is a plate used for rectification. An elevating pin 47 transfers the wafer W to the cooling plate 43. Also, an elevating pin 48 transfers the wafer W to the hot plate 44 and between the cooling plate 43 and the hot plate 44.

A detailed description of the cooling unit that constitutes the rack unit U4 will be omitted. However, in a manner analogous to the heating treatment unit 4, an apparatus having a housing with a cooling plate of a water cooling type therein and a transfer hole that is opened toward the transfer passage RS1 may be used as the cooling treatment unit.

Also, as shown in FIG. 5, in the housing 50, an exhaust unit 5 includes a suction hole 51 that is opened toward the transfer passage RS1 and an exhaust pipe 54 that sucks and exhausts the inside of an exhaust room 53 in the housing 50. The exhaust unit 5 exhausts the inside of the exhaust room 53 to create negative pressure, thereby introducing gas in the transfer passage RS1 and removing particles contained therein.

The main arm A1 is configured to transfer the wafer W among the treatment units in the rack units U1 to U4, the developing treatment unit 3, a transfer stage of the first transfer rack unit TU1, and a transfer stage of the second transfer rack unit TU2. As shown in FIG. 5, the main arm A1 includes, for example, two arm bodies 61 and 62 for supporting a circumference region on a back surface of the wafer W. The arm bodies 61 and 62 are configured to be extended and retracted, independently, on a transfer base 63. Also, the arm bodies 61 and 62 are configured to be extended into and retracted from the housing 30 of the developing treatment unit 3 through the transfer hole 37. The transfer base 63 is disposed on an elevating base 64 so as to be capable of rotating around a vertical axis of the same. The elevating base 64 is configured to be elevated along an elevating guide rail 67. A guide rail 65 is horizontally disposed on the front sides of the four exhaust units 5 of the rack units U1 to U4. The main arm A1 is configured to move in a horizontal direction along the guide rail 65 through the elevating guide rail 67. A hole 66 is formed on a position of the guide rail 65, which corresponds to the suction hole 51. Exhaust of the transfer passage RS1 is performed through the hole 66. A lower portion of the elevating guide rail 67 reaches the inside of the exhaust unit 5 beyond a lower portion of the guide rail 65, thereby being suspended on a drive belt 55 for moving the elevating guide rail 67 along the guide rail 65.

Next, other treatment layers will be briefly described.

As shown in FIG. 3, the DEV layer B5 is configured to be the same as the DEV layer B1 and transfers the wafer W through a main arm A5 that is configured to be the same as the main arm A1. However, there is a difference where the BCT layer B2, the COT layers B3 and B7, and the TCT layers B4 and B8 employ a coating unit instead of the developing treatment unit 3 of the DEV layer B1. The coating unit is configured to apply a chemical solution for forming an antireflection film or a chemical solution (e.g., a resist liquid) for forming a resist film. A basic structure of the coating unit is nearly the same as that in the developing treatment unit 3. However, unlike the developing treatment unit 3, the coating unit drops the chemical solution for coating at the center of the wafer W while the spin chuck rotates, and spreads the dropped chemical solution through centrifugal force, thereby forming a coating film. Also, the treatment layers B2, B3, B4, B7, and B8 of such coating lineages are partially different from the DEV layer B1 in units which constitute the rack units U1 to U4. That is, apart from including a heating unit and a cooling unit which are the same as those in the rack units U1 to U4 of the DEV layer B1, a circumference exposing unit for exposing a circumference of the wafer W is disposed in any one of the treatment layers. And, in the rack units U1 to U4 of the COT layer B3 and B7, a unit for performing a hydrophobic treatment on the wafer W is included. Moreover, in these treatment layers B2, B3, B4, B7, and B8, main arms A2, A3, A4, A7, and A8 having the same configurations as the main arm A1 are disposed such that the wafer W is transferred through these arms.

There is a difference where a cleaning/surface treatment layer B6 (e.g., a C/S layer) employs a cleaning unit instead of the developing treatment unit 3 of the DEV layer B1. A basic structure of the cleaning unit has a structure in which a cup is disposed around the spin chuck, similar to the developing treatment unit 3. However, unlike the developing treatment unit 3, the cleaning unit drops de-ionized water or a chemical solution for cleaning at the center of the wafer W while the spin chuck spins and spreads the dropped water or solution through centrifugal force, thereby cleaning a surface of the wafer W. Also, the cleaning/surface treatment layer B6 (e.g., the C/S layer) is partially different from the DEV layer B1 in units that constitute the rack units U1 to U4. That is, apart from including a heating unit and a cooling unit which are the same as those in the rack units U1 to U4 of the DEV layer B1, a curing unit that is not shown is disposed. The curing unit irradiates ultraviolet light to the wafer W, thereby performing a curing treatment on an uppermost layer of the wafer W. Also, in the C/S layer B6, the wafer W is transferred by the main arm A6 which has the same structure as that in the main arm A1.

As described above, the first transfer layer M1 is disposed between the DEV layer B1 at an upper side of the first sub-block SB1 and the BCT layer B2 thereof. The first transfer layer M1 is configured to transfer the wafer W from the first transfer rack unit TU1 adjacent to the carrier block S1 to the second transfer rack unit TU2, which is arranged in a middle position, by moving straight to the same. The first transfer layer M1 includes a shuttle arm 7.

The second transfer layer M2 is disposed on a lowermost stage of the first sub-block SB1. Besides transferring the wafer W from the second transfer rack unit TU2 to the first transfer rack unit TU1 by moving straight to the same, the second transfer layer M2 is configured to be the same as the first transfer layer M1.

The third transfer layer M3 is disposed between the DEV layer B5 on an upper side of the second sub-block SB2 and the C/S layer B6 thereof. Besides transferring the wafer W from the second transfer rack unit TU2 to the third transfer rack unit TU3, which is adjacent to the interface bock S3, by moving straight to the same, the third transfer layer M3 is configured to be the same as the first transfer layer M1.

The fourth transfer layer M4 is disposed on a lowermost stage of the second sub-block SB2. Besides transferring the wafer W from the third transfer rack unit TU3 to the second transfer rack unit TU2, the fourth transfer layer M4 is configured to be the same as the first transfer layer M1.

As shown in FIG. 2, in the transfer passage RS1 of the treatment layers B1 to B4 of the first sub-block SB1, a region in proximity with the carrier block 51 is configured as a first wafer transfer region RS2. The first transfer rack unit TU1 is disposed in the first wafer transfer region RS2. Also, in the first wafer transfer region RS2, a transfer arm D1 serving as an elevating transfer device is disposed so as to transfer the wafer W to the first transfer rack unit TU1.

As shown in FIG. 3, the first transfer rack unit TU1 includes a transfer stage TRSB at a position corresponding to the second transfer layer M2, transfer stages TRS1 at positions corresponding to the respective DEV layers B1, and a transfer stage TRSA at a position corresponding to the first transfer layer M1. Also, the first transfer rack unit TU1 includes two transfer stages TRS2 at positions corresponding to the BCT layer B2, two transfer stages TRS3 at positions corresponding to the COT layer B3, and two transfer stages TRS4 at positions corresponding to the TCT layer B4.

A transfer arm C is configured to access to the transfer stage TRS2 corresponding to the BCT layer B2 from the transfer stage TRSB corresponding to the second transfer layer M2 which is arranged at the lowermost stage of the first transfer rack unit TU1. Also, the transfer arm D1 is configured to access from the lowermost stage TRSB to the uppermost stage TRS4 corresponding to the TCT layer B4.

The shuttle arm 7 is configured to access the transfer stages TRSA and TRSB which correspond to the first and second transfer layers M1 and M2, respectively. The main arms A1 to A4 of the respective treatment layers are configured to access the transfer stages TRS1 to TRS4 which correspond to the DEV layer B1, the BCT layer B2, the COT layer B3, and the TCT layer B4, respectively.

As shown in FIG. 2, there is provided a second wafer transfer region RS3 between the transfer passage RS1 of the treatment layers B1 to B4 of the first sub-block SB1 and the transfer passage RS1 of the treatment layers B5 to B8 of the second sub-block SB2. A second transfer rack unit TU2 is disposed in the second wafer transfer region RS3. Also, in the second wafer transfer region RS3, a transfer arm D2 serving as an elevating transfer device is disposed so as to transfer the wafer W to the second transfer rack unit TU2.

As shown in FIG. 3, the second transfer rack unit TU2 includes a transfer stage TRSD at a position corresponding to the fourth transfer layer M4, two transfer stages TRS5 at positions corresponding to the DEV layers B5, and a transfer stage TRSC at position corresponding to the third transfer layer M3. Also, the second transfer rack unit TU2 includes two transfer stages TRS6 at positions corresponding to the C/S layer B6, two transfer stages TRS7 at positions corresponding to the COT layer B7, and two transfer stages at positions corresponding to the TCT layer B8.

The transfer arm D2 is configured to access from the lowermost transfer stage TRSD to the uppermost transfer stage TRS8 corresponding to the TCT layer B8.

The shuttle arm 7 is configured to access the transfer stages TRSC and TRSD corresponding to the third and fourth transfer layers M3 and M4. The main arms A5 to A8 of the respective treatment layers are configured to access the transfer stages TRS5 to TRS8 which correspond to the DEV layer B5, the C/S layer B6, the COT layer B7, and the TCT layer B8, respectively.

As shown in FIG. 2, in the transfer passage RS1 of the DEV layer B5, a region in proximity with the interface block S3 is configured as a third wafer transfer region RS4. The third transfer rack unit TU3 is disposed in the third wafer transfer region RS4.

As shown in FIG. 3, the third transfer rack unit TU3 includes a transfer stage TRSF at a position corresponding to the fourth transfer layer M4, two transfer stages TRS9 at positions corresponding to the DEV layers B5, and a transfer stage TRSE at a position corresponding to the third transfer layer M3.

The shuttle arm 7 is configured to access the transfer stages TRSE and TRSF which correspond to the third and fourth transfer layers M3 and M4, respectively. Also, the main arm A5 is configured to access the transfer stage TRS9 corresponding to the DEV layer B5.

The transfer stages TRS1 to TRS9 and TRSA to TRSF have the same structure, in which, for example, a housing of a rectangular parallelepiped shape is provided, a stage for mounting the wafer W is interposed in the corresponding housing, and a pin capable of being protruded and depressed on the corresponding stage is disposed. Also, these transfer stages include a device for controlling a temperature of the wafer W to a predetermined temperature.

In this embodiment, two transfer stages are disposed on the respective treatment layers B2 to B4 and B6 to B8 and one transfer stage is disposed on the DEV layers B1 and B5 and the transfer layers M1 to M4, but it is not limited thereto. Therefore, the number of transfer stages on each treatment layer may be appropriately decided depending upon a scheduled transfer sequence.

As shown in FIG. 3, the interface block S3 includes a buffer unit 9 so as to temporarily wait for a plurality of the wafers W upon being carried in and out from the exposing apparatus 200. The buffer unit 9 includes a first carry-in buffer cassette ($Bu_{IN}1$) 91, a first carry-out buffer cassette ($Bu_{OUT}1$) 92, a second carry-in buffer cassette ($Bu_{IN}2$) 93, and a second carry-out buffer cassette ($Bu_{OUT}2$) 94. The first carry-in buffer cassette ($Bu_{IN}1$) 91 is configured to receive the wafer W that is carried in the exposing apparatus 200 when a first-time exposing treatment is performed. The first carry-out buffer cassette ($Bu_{OUT}1$) 92 is configured to receive the wafer W that is discharged from the exposing apparatus 200 after the first-time exposing treatment is completed. The second carry-in buffer cassette ($Bu_{IN}2$) 93 is configured to receive the wafer W that is carried in the exposing apparatus 200 when a second-time exposing treatment is performed. The second carry-out buffer cassette ($Bu_{OUT}2$) 94 is configured to receive the wafer W that is discharged from the exposing apparatus 200 after the second-time exposing treatment is completed. Also, these cassettes are disposed from the top of the buffer 9 in the order of the second carry-in buffer cassette ($Bu_{IN}2$) 93, the first carry-in buffer cassette ($Bu_{IN}1$) 91, the first carry-out buffer cassette ($Bu_{OUT}1$) 92, and the second carry-out buffer cassette ($Bu_{OUT}2$) 94. As shown in FIG. 2, a carry-in interface arm E1 and a carry-out interface arm E2 are disposed between the buffer unit 9 and the treatment block S2. The carry-in interface arm E1 is configured to carry the wafer W in the carry-in buffer cassette 91 or 93 after a coating treatment. Also, the carry-out interface arm E2 is configured to carry out the wafer W from the carry-out buffer cassette 92 or 94. The interface arms E1 and E2 are configured to access the transfer stages TRS9, TRSE, and TRSF of the third transfer rack unit TU3. Therefore, the wafer W is transferred first to the transfer stage TRSE by the shuttle arm 7 of the third transfer layer M3 and then carried in the carry-in buffer cassette 91 or 93 by the carry-in interface arm E1. Also, when the wafer W that is carried out from the carry-out buffer cassette 92 or 94 is returned, it is transferred first to the transfer stage TRS9 or TRSF by the carry-out interface arm E2.

As shown in FIG. 2, a first-time exposure interface arm E3 and a second-time exposure interface arm E4 are disposed between the buffer unit 9 and the exposing apparatus 200. The first-time exposure interface arm E3 is configured to transfer the wafer W between the buffer unit 9 and the exposing apparatus 200 for a first-time exposing treatment. The second-time exposure interface arm E4 is configured to transfer the wafer W between the buffer unit 9 and the exposing apparatus 200 for a second-time exposing treatment.

Figure 6:
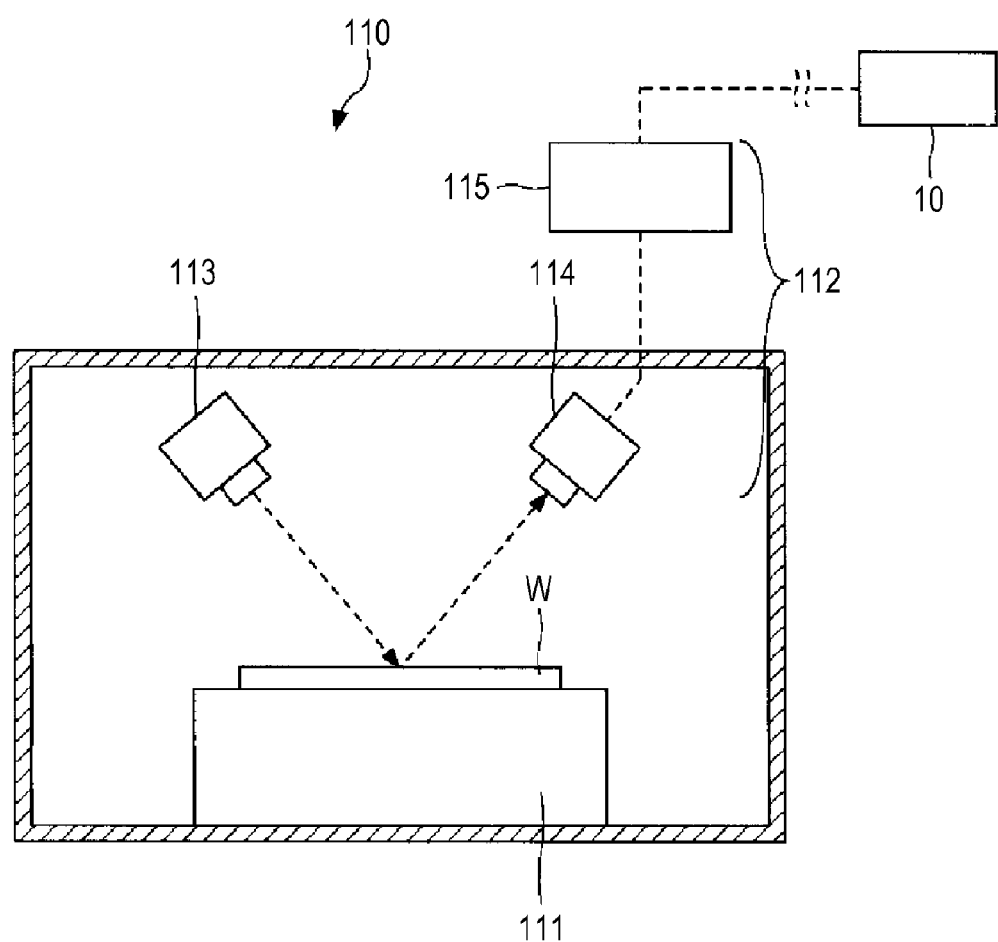
FIG. 6 is a vertical sectional view showing a schematic configuration of a line width measuring apparatus.
Figure 7A:
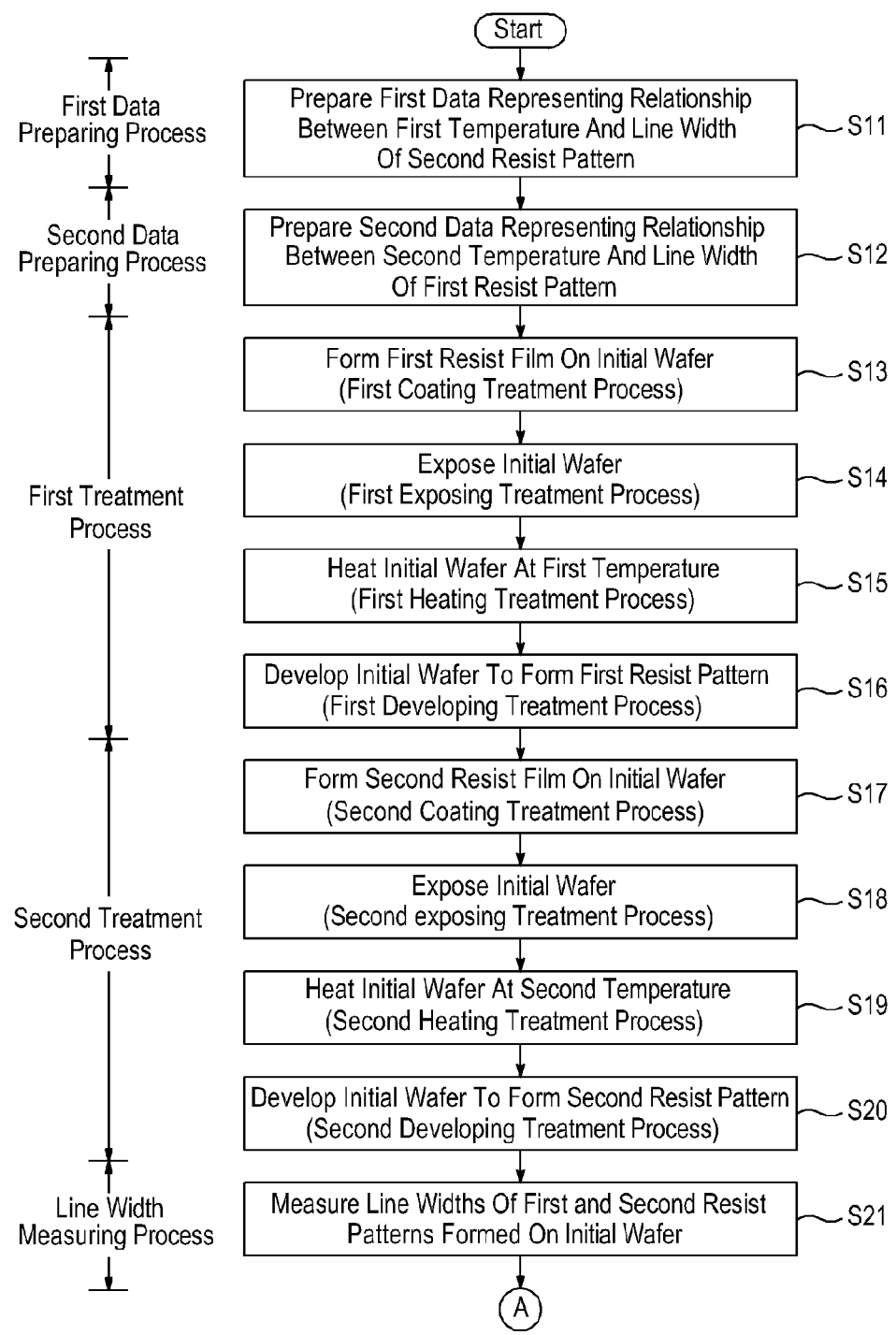

With reference to FIG. 6, a line width measuring apparatus 110 will be described. FIG. 6 is a vertical sectional view showing a schematic configuration of the line width measuring apparatus 110.

The line width measuring apparatus 110, as shown in FIG. 6, includes, for example, a mounting table 111 for mounting the wafer W in a horizontal direction and an optical surface topography measuring arrangement 112. The mounting table 111 is made of, for example, an X-Y stage, and configured to be movable in a 2-dimensional transverse direction. The optical surface topography measuring arrangement 112 includes, for example, a light irradiation unit 113, a light detection unit 114, and a calculation unit 115. The light irradiation unit 113 is configured to irradiate light onto the wafer W from an inclined direction. The light detection unit 114 is configured to detect the light that is irradiated from the light irradiation unit 113 and then reflected from the wafer W. The calculation unit 115 is configured to calculate a line width CD of a resist pattern on the wafer W based on information related to the detected light from the light detection unit 114. The line width measuring apparatus 110 is configured to measure the line width of the resist pattern by using, for example, a Scatterometry technique. Upon using the Scatterometry technique, the calculation unit 15 may collate a light intensity distribution, which is detected by the light detection unit 114, on the surface of the wafer W with a virtual light intensity distribution that is stored in advance. As such, a line width CD of a resist pattern corresponding to the collated virtual light intensity distribution is calculated to be measured.

Also, the line width measuring apparatus 110 may measure line widths at a plurality of measurement points on a surface of the wafer W by moving the wafer W in a relative horizontal direction with respect to the light irradiation unit 113 and the light detection unit 114.

For example, a first-time patterning process is performed on each wafer W of a wafer group consisting of the plurality of wafers W by changing the heating temperature (e.g., a first temperature T1) of the heating treatment with respect to each wafer W through the heating treatment unit 4, thereby forming a first-time resist pattern P1 (e.g., a first resist pattern). Thereafter, a second-time patterning process is performed on each wafer W that have been subject to the first-time patterning process, thereby forming a second-time resist pattern P2 (e.g., a second resist pattern). And then, line widths CD1 and CD2 of the first and second resist patterns P1 and P2 are measured by using the line width measuring apparatus 110. The measured results of the line width measuring apparatus 110 are outputted, for example, from the calculation unit 15 to a main body control unit 10 to be described later. Accordingly, first data (e.g., a sensitivity $ST_{12}$ to be described later) is prepared, which represents a relationship between the first temperature T1 and the line width CD2 of the second resist pattern P2.

A wafer treatment, which is performed in a coating/developing treatment system 1 having the above-described configuration, may be controlled by the main body control unit 10 shown in FIG. 1. The main body control unit 10 is also configured to control measuring a line width of a resist pattern on the wafer W through the line width measuring apparatus 110. The main body control unit 10 is configured with, for example, a general purpose computer having a central processing unit (CPU), a memory and the like, and to execute a program stored therein, thereby controlling the wafer treatment and the measurement of a line width. Also, the program of the main body control unit 10 may be installed through a computer-readable storage medium.

Figure 8A:
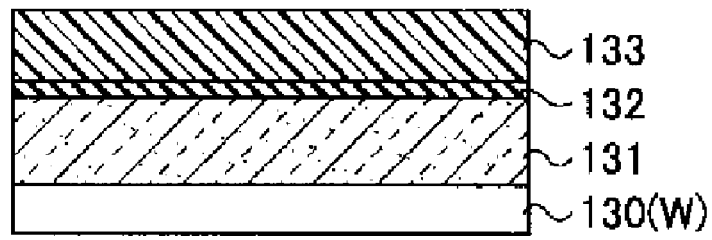
FIGS. 8A to 8J are sectional views showing states of a wafer in the respective processes of the substrate treatment method in accordance with Embodiment 1 of the present disclosure.
Figure 8B:
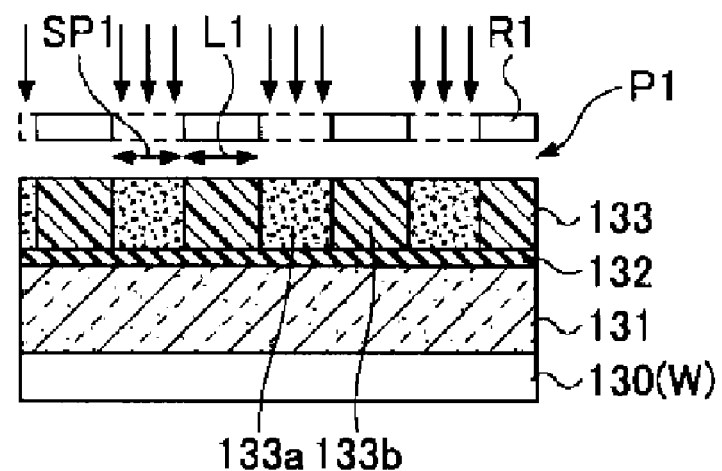
Figure 8C:
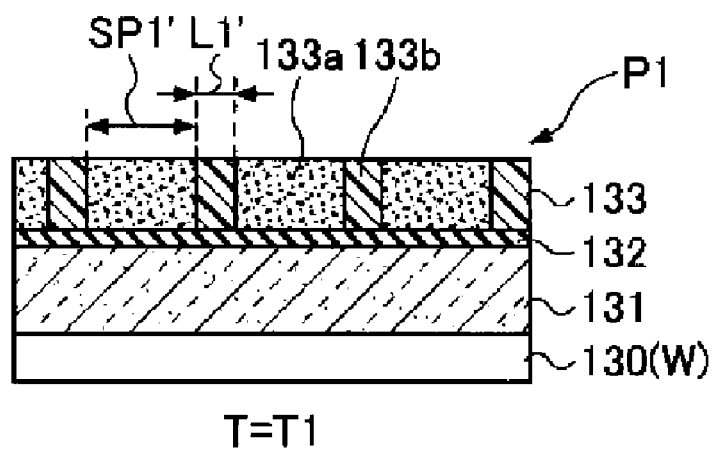
Figure 8D:
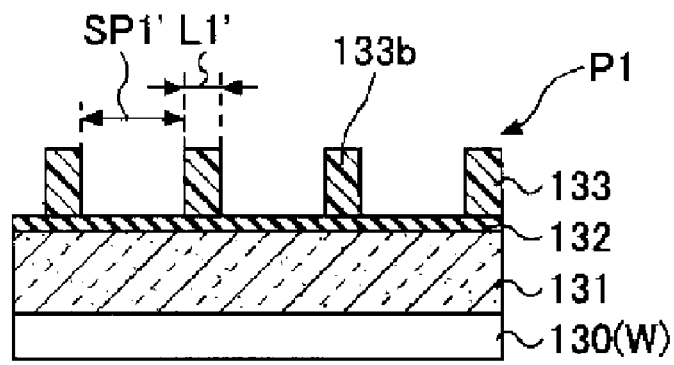
Figure 8E:
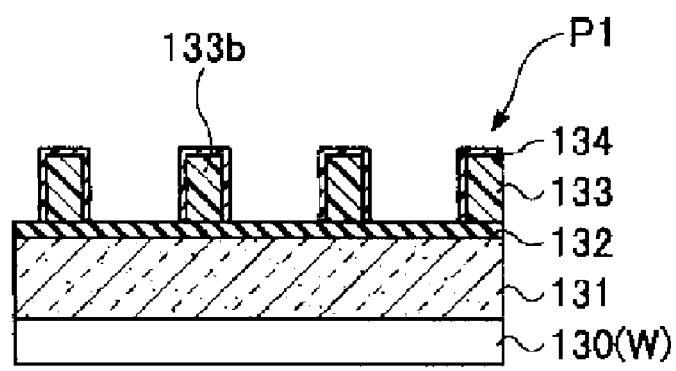
Figure 8F:
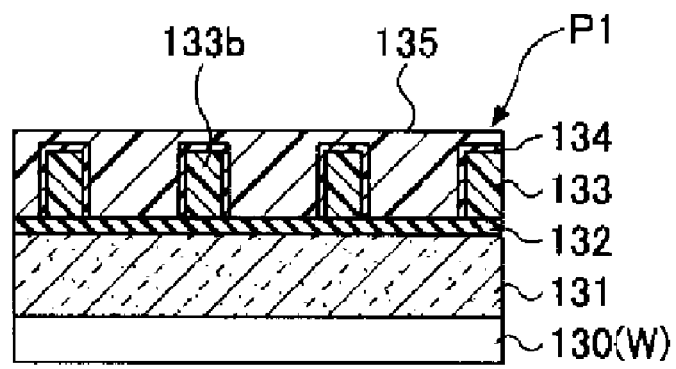
Figure 8G:
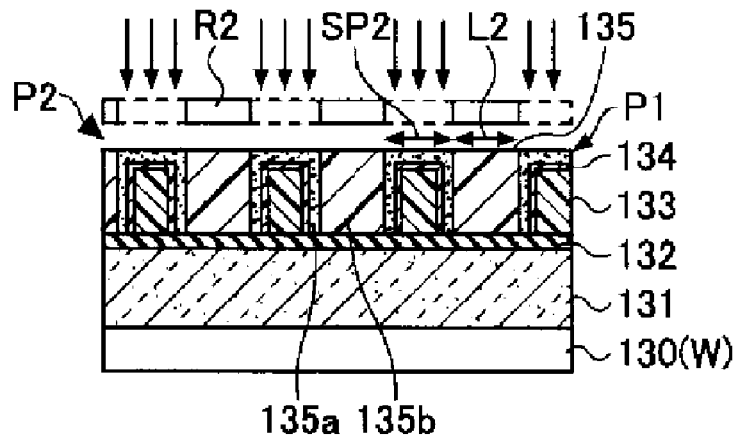
Figure 8H:
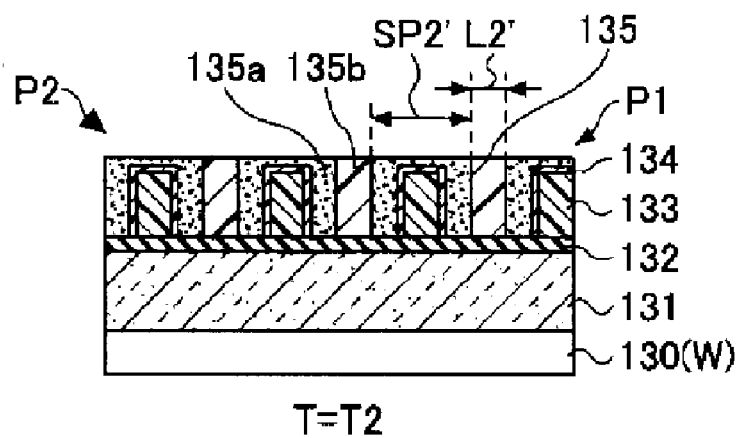
Figure 8I:
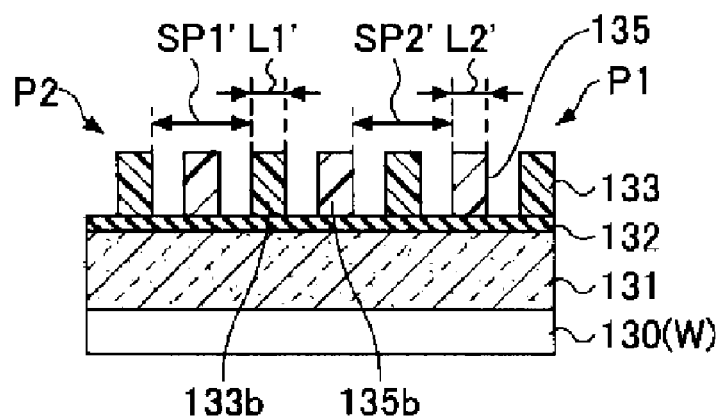
Figure 8J:
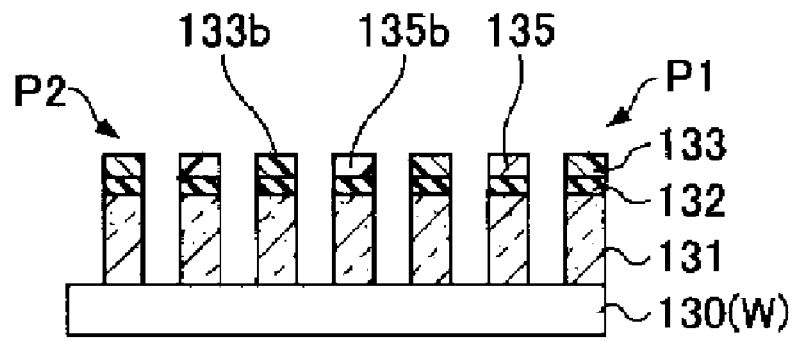
Figure 9A:
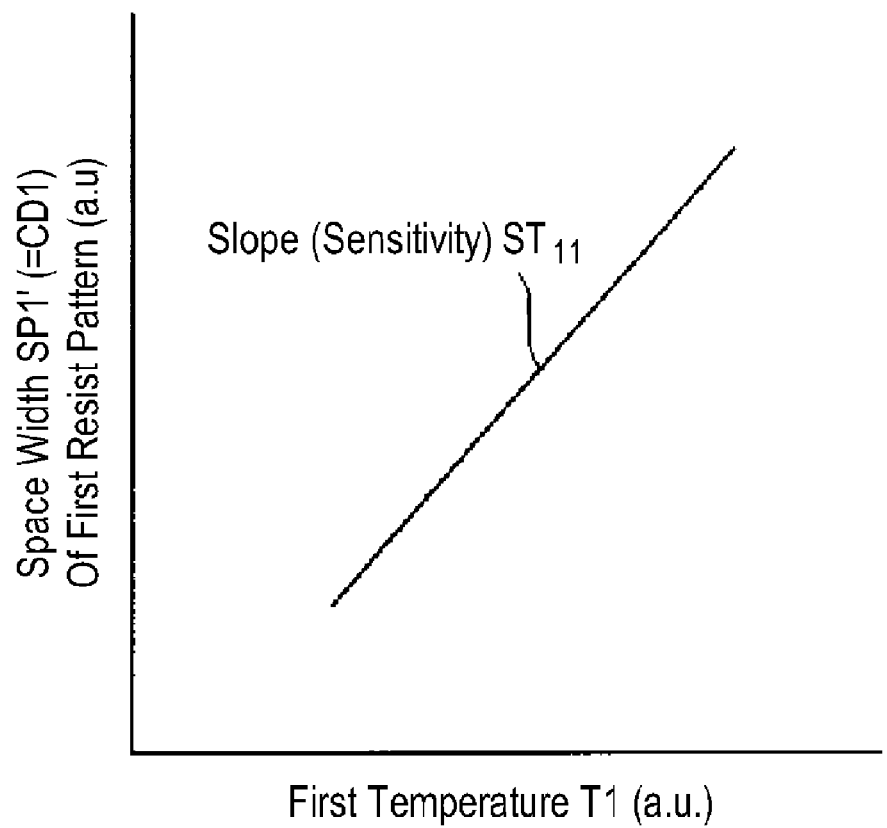
FIGS. 9A to 9D are graphs showing relationships between space widths of first and second resist patterns and first and second temperatures.
Figure 9B:
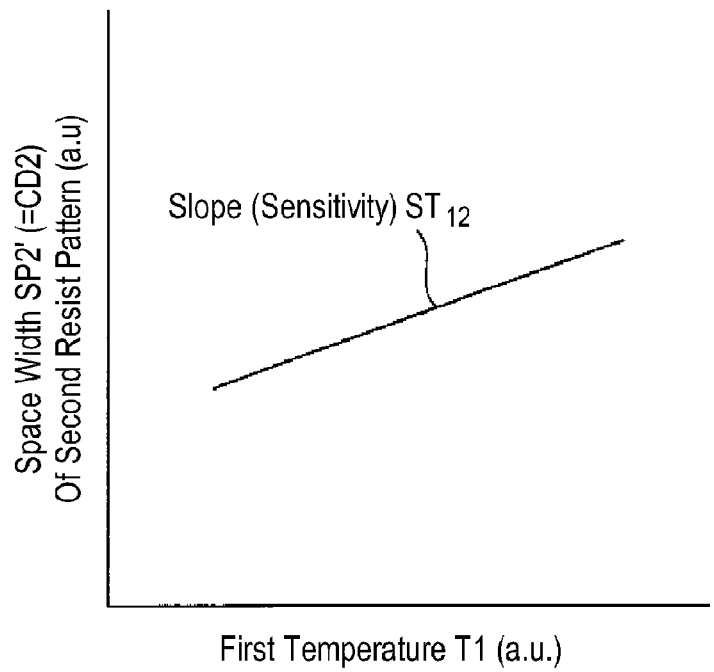
Figure 9C:
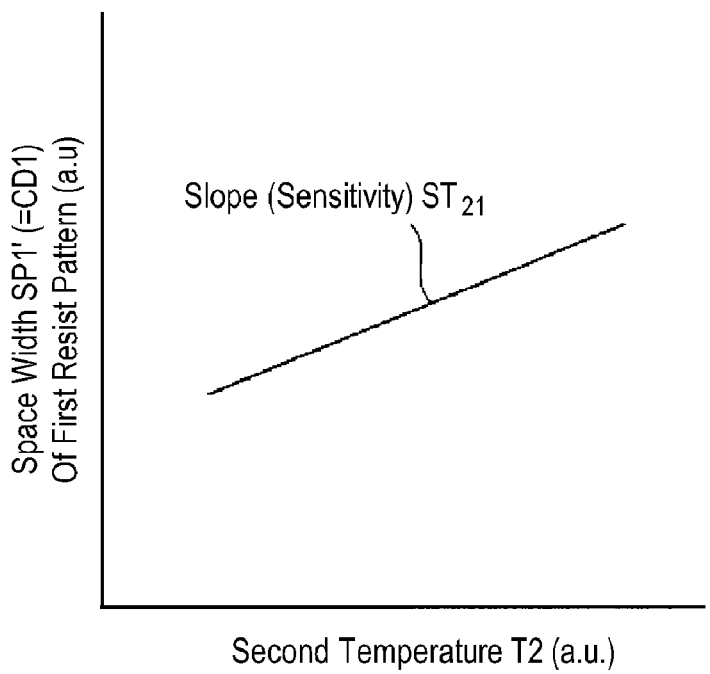
Figure 9D:
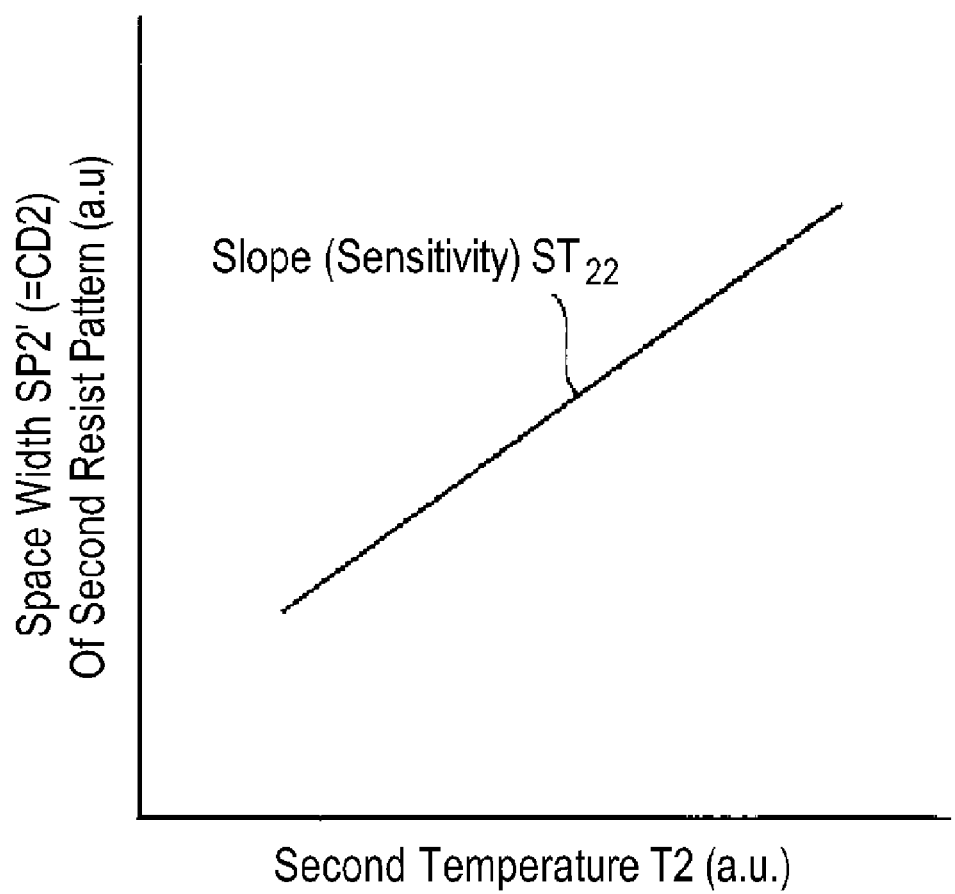
Figure 10:
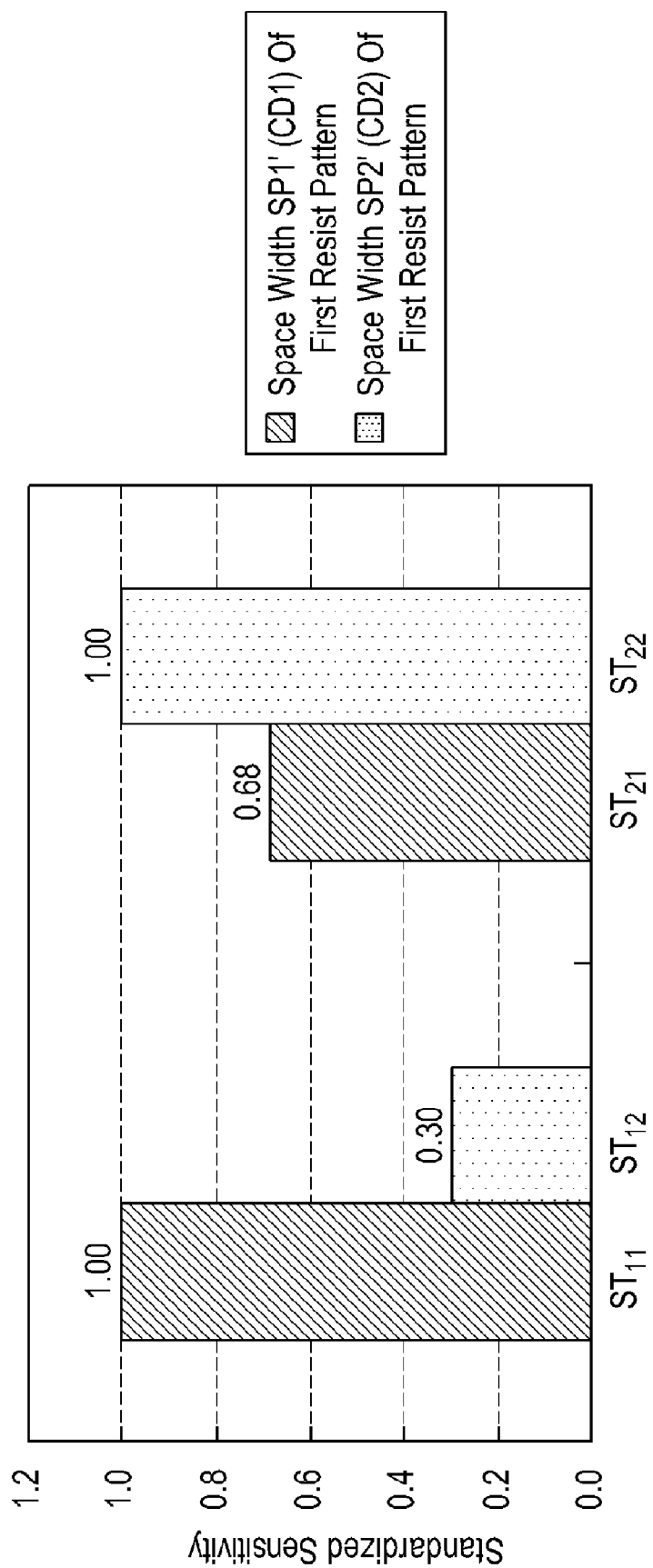
FIG. 10 is a graph showing the sensitivity of a space width with respect to temperature.

With reference to FIGS. 7 to 10, a substrate treatment method through the substrate treatment system according to this embodiment will be described. FIGS. 7A and 7B are flow charts showing respective processes of the substrate treatment method according to this embodiment. FIGS. 8A through 8J are sectional views showing states of a wafer in the respective processes of the substrate treatment method according to this embodiment. FIGS. 9A through 9D are graphs showing relationships between space widths of first and second resist patterns and first and second temperatures. FIG. 10 is a graph showing the sensitivity of a space width with respect to temperature.

As shown in FIG. 7, the substrate treatment method according to this embodiment includes a first data preparing process (Step S11), a second data preparing process (Step S12), a first treatment process (Step S13 to Step S16), a second treatment process (Step S17 to Step S20), a line width measuring process (Step S21), a first treatment process (Step S22 to Step S25), and a second treatment process (Step S26 to Step S29).

The first treatment process (Step S13 to S16) and the second treatment process (Step S17 to S20) perform a first treatment process and a second treatment process on an initial wafer W. The first treatment process (Step S13 to Step S16) includes a first coating treatment process (Step S13), a first exposing treatment process (Step S14), a first heating treatment process (Step S15), and a first developing treatment process (Step S16). The second treatment process (Step S17 to Step S20) includes a second coating treatment process (Step S17), a second exposing treatment process (Step S18), a second heating treatment process (Step S19), and a second developing treatment process (Step S20).

Also, the first treatment process (Step S22 to Step S25) and the second treatment process (Step S26 to Step S29) perform a first treatment process and a second treatment process on a subsequent wafer W. The first treatment process (Step S22 to Step S25) includes a first coating treatment process (Step S22), a first exposing treatment process (Step S23), a first heating treatment process (Step S24), and a first developing treatment process (Step S25). The second treatment process (Step S26 to Step S29) includes a second coating treatment process (Step S26), a second exposing treatment process (Step S27), a second heating treatment process (Step S28), and a second developing treatment process (Step S29).

Initially, the first data preparing process (Step S11) is performed. In the first data preparing process (Step S11), first data is prepared, which represents a relationship between a first temperature T1 and a space width SP2' of a second resist pattern P2.

The first coating treatment process (Step S13) and the first exposing treatment process (Step S14), which will be described later, are performed on each wafer W of a wafer group consisting of plurality of wafers W comprising the initial wafer and subsequent wafers, and then the first heating treatment process (Step S15) to be described later is performed with the first temperature T1 changed on each wafer W. Afterwards, the first developing treatment process (Step S16) through the second developing treatment process (Step S20) are performed, thereby forming a first resist pattern P1 and the second resist pattern P2 on the initial wafer W as shown in FIGS. 8A through 8J. And then, the space width SP2' of the second resist pattern P2 formed on the initial wafer W is measured by using the line width measuring apparatus 110. In this way, the first data (corresponding to $ST_{12}$ to be described later) is prepared, which represents the relationship between the first temperature T1 and the space width SP2' of the second resist pattern P2.

Also, in the first data preparing process (Step S11), a space width SP1' of the first resist pattern P1 as formed is measured by using the line width measuring apparatus 110. Thereby, third data (corresponding to $ST_{11}$ to be described later) is also prepared, which represents a relationship between the first temperature T1 and the space width SP1' of the first resist pattern P1.

Herein, the space width SP1' of the first resist pattern P1 and the space width SP2' of the second resist pattern P2 may correspond to line widths of resist patterns according to the present disclosure.

Thereafter, the second data preparing process (Step S12) is performed. In the second data preparing process (Step S12), second data is prepared, which represents a relationship between a second temperature T2 and the space width SP1' of the first resist pattern P1.

The first coating treatment process (Step S13) through the second exposing treatment process (Step S18), which will be described later, are performed on each wafer W of the wafer group consisting of the plurality of wafers W, and then the second heating treatment process (Step S19) to be described later is performed with the second temperature T2 changed on each wafer W. Thereafter, the second developing treatment process (Step S20) to be described later is performed to form the first resist pattern P1 and the second resist pattern P2 on the initial wafer W. And then, the space width SP1' of the first resist pattern P1 as formed is measured by using the line width measuring apparatus 110. In this way, the second data (corresponding to $ST_{21}$ to be described later) is prepared, which represents a relationship between the second temperature T2 and the space width SP1' of the first resist pattern P1.

Also, in the second data preparing process (Step S12), the space width SP2' of the second resist pattern P2 as formed is measured by using the line width measuring apparatus 110. Thereby, fourth data (corresponding to $ST_{22}$ to be described later) is also prepared, which represents a relationship between the second temperature T2 and the space width SP2' of the second resist pattern P2.

Further, the first treatment process and the second treatment process may be performed on each wafer W of the wafer group consisting of the plurality of wafers W under a plurality of conditions which are set to a two-by-two matrix by independently changing two variables that consist of the first temperature T1 and the second temperature T2 with respect to each wafer W. In this way, the first data preparing process (Step S11) and the second data preparing process (Step S12) may be performed at a time.

The first temperature T1 and the second temperature T2 may be setting temperatures of a hot plate 44. Alternatively, instead of a hot plate, the initial wafer W may be subject to a heating treatment by a heat source such as an ultraviolet lamp. When the ultraviolet lamp is used as a heat source, an ambient temperature of the heat source or the initial wafer W, which is subject to a heating treatment by the heat source, may be the first temperature T1 and the second temperature T2.

Next, the first treatment process (Step S13 to Step S16) is performed on the initial wafer W.

Initially, the first coating treatment process (Step S13) is performed on the initial wafer W. In the first coating treatment process (Step S13), a resist is applied on the initial wafer W to form a first resist film 133. FIG. 8A shows a state of the initial wafer W in the first coating treatment process (Step S13).

Before performing the first coating treatment process (Step S13), a bottom anti-reflective coating 132 has been formed over the wafer 130 (e.g., the initial wafer W) having a film 131 to be etched which has been formed in advance on a surface of the wafer 130.

The carrier 20 in which the plurality of wafers W are received is carried in the carrier block S1 from outside and then one sheet of the wafers W is taken out from the carrier 20 by the transfer arm C to be carried in the treatment block S2. And then, the wafer W is carried in the first coating treatment unit 11. For example, the initial wafer W is transferred first from the transfer arm C to the transfer stage TRS2 of the first transfer rack unit TU1, and then the main arm A2 of the BCT layer B2 receives the initial wafer W on the transfer stage TRS2. Thereafter, the initial wafer W is sequentially subject to treatments according to a transfer order of a cooling treatment unit→an anti-reflective coating treatment unit (corresponding to the developing treatment unit 3 of FIG. 4)→a heating treatment unit. In this way, the bottom anti-reflective coating (BARC) 132 is formed over the wafer 130 (e.g., the initial wafer W) having the film 131 to be etched that has been formed on the surface of the wafer 130. Afterwards, the initial wafer W is returned to the transfer stage TRS2.

Continuously, the initial wafer W on the transfer stage TRS2 is transferred to the transfer stage TRS3 of the first transfer rack unit TU1 by the transfer arm D1, and then, the main arm A3 of the COT layer B3 receives the initial wafer W on the transfer stage TRS3. Thereafter, the initial wafer W is sequentially subject to treatments according to a transfer order of the cooling treatment unit→a resist coating treatment unit (corresponding to the developing treatment unit 3 of FIG. 4)→the heating treatment unit. In this way, the first resist film 133 is formed on top of the bottom anti-reflective coating (BARC) 132. Afterwards, the initial wafer W is transferred to a circumference exposing treatment unit so as to be subject to a circumference exposing treatment, and then, is returned to the transfer stage TRS3.

An example of a resist, which is used for forming the first resist film 133, may be a chemically amplified resist. For example, a chemically amplified positive resist may be used in this embodiment, which is capable of corresponding to an exposing treatment using an ArF excimer laser (having a wavelength of 193 nm).

Also, a top anti-reflective coating (TARC) may be formed on top of the first resist layer 133. For this purpose, the initial wafer W of the transfer stage TRS3 is transferred to the transfer stage TRS4 of the first transfer rack unit TU1 by the transfer arm D1, and then, the main arm A4 receives the initial wafer W on the transfer stage TRS4. Thereafter, the initial wafer W is sequentially subject to treatments according to a transfer order of the cooling treatment unit→a second anti-reflective coating forming unit (corresponding to the developing treatment unit 3 of FIG. 4)→the heating treatment unit. In this way, the top anti-reflective coating (TARC) may be formed on top of the first resist film 133.

Afterwards, the initial wafer W is returned to the transfer stage TRS4. As such, the first-time coating treatment is completed.

Next, the first exposing treatment process (Step S14) is performed on the initial wafer W. In the first exposing treatment process (Step S14), the initial wafer W on which the first resist film 133 has been formed is exposed. FIG. 8B shows a state of the initial wafer W in the first exposing treatment process (Step S14).

The initial wafer W, which is returned to the transfer stage TRS4, is transferred to the transfer stage TRSA by the transfer arm D1. Continuously, the shuttle arm 7 of the first transfer layer M1 receives the initial wafer W on the transfer stage TRSA. And then, the shuttle arm 7 turns toward and moves to the second transfer rack unit TU2, thereby transferring the initial wafer W to the transfer stage TRSC of the second transfer rack unit TU2. The shuttle arm 7 of the third transfer layer M3 that belongs to the second sub-block SB2 receives the initial wafer W on the transfer stage TRSC. Thereafter, the shuttle arm 7 turns toward and moves to the third transfer rack unit TU3, thereby transferring the initial wafer W to the transfer stage TRSE of the third transfer rack unit TU3. Afterwards, the initial wafer W on the transfer stage TRSE is carried in the first carry-in buffer cassette ($Bu_{IN}1$) 91 of the buffer unit 9.

When one lot of the wafers W is retained in the first carry-in buffer cassette ($Bu_{IN}1$) 91, one among one lot of the wafers W is transferred to the exposing apparatus 200 by the first-time exposure interface arm E3. And then, a first-time exposing treatment is performed on the wafer W that has been transferred to the exposing apparatus 200.

When the first-time exposing treatment is performed, as shown in FIG. 8B, a selected portion of the first resist film 133 is exposed by using a first reticle R1 and then a soluble portion 133a, which is selectively solubilized against a developing solution that is made of, e.g., an alkali solvent, is generated. By selectively generating the soluble portion 133a, the first resist pattern P1, which is made of the soluble portion 133a and an insoluble portion 133b that are soluble and insoluble against the developing solution, respectively, is obtained in the first resist film 133.

In this embodiment, the first resist pattern P1 is obtained by using, for example, the first reticle R1 having a pattern of which lines are arranged. As shown in FIG. 8B, a line width L1 and the space width SP1 of the first resist pattern P1 may be, for example, 32 nm and 32 nm, respectively.

Thereafter, the initial wafer W for which the first-time exposing treatment has been completed is carried in the interface block S3. For example, the initial wafer W is carried in the first carry-out buffer cassette ($Bu_{OUT}1$) 92 by the first-time exposure interface arm E3.

Afterwards, the first heating treatment process (Step S15) is performed on the initial wafer W. In the first heating treatment process (Step S15), the initial wafer W is subject to a heating treatment at the first temperature T1. FIG. 8C shows a state of the initial wafer W in the first heating treatment process (Step S15).

The initial wafer W of the first carry-out buffer cassette ($Bu_{OUT}1$) 92 is carried in the treatment block S2 to be subject to a first-time developing treatment by the first developing treatment unit 14 of the second sub-block SB2. For example, the initial wafer W of the first carry-out buffer cassette (Bu$_{OUT}$1) 92 is taken out by the carry-out interface arm E2 to be transferred to the transfer stage TRS9 which corresponds to one of the DEV layers B5 of the third transfer rack unit TU3. Thereafter, the initial wafer W on the transfer stage TRS9 is received by the main arm A5 of the DEV layer B5, and then transferred to the heating unit 4 that is included in the rack units U1 to U4, thereby being subject to a bake treatment after an exposing treatment in the DEV layer B5.

In the heating treatment unit 4, the initial wafer W is carried in first from a transfer hole 42 to be mounted on a cooling plate 43 shown in FIG. 5. Subsequently, the cooling plate 43 moves such that the initial wafer W is moved to an upper portion of the hot plate 44. The initial wafer W is transferred from the cooling plate 43 to an elevating pin 48, thereby being mounted on the hot plate 44 by the elevating pin 48. As such, the heating treatment (e.g., the bake treatment after the exposing treatment) of the initial wafer W is started. After a predetermined time has passed, the initial wafer W is separated from the hot plate 44 by the elevating pin 48 such that the heating treatment of the initial wafer W is completed. And then, the initial wafer W is transferred from the elevating pin 48 to the cooling plate 43, thereby being cooled. Subsequently, the initial wafer W is transferred from the cooling plate 43 to a postion outside of the heating unit 4 through the transfer hole 42.

Through the first heating treatment process (Step S15), a change from the insoluble portion 133b to the soluble portion 133a is promoted. Therefore, as shown in FIG. 8C, the line width L1 of the first pattern P1 is slightly reduced to become L1' and the space width SP1 of the first pattern P1 is slightly increased to become SP1'.

Subsequently, the first developing treatment process (Step S16) is performed on the initial wafer W. In the first developing treatment process (Step S16), the initial wafer W for which the first heating treatment process (Step S15) has been performed is subject to a developing treatment, thereby forming the first resist pattern P1. FIG. 8D shows a state of the initial wafer W in the first developing treatment process (Step S16).

The initial wafer W, which has been subject to the first heating treatment process (Step S15), is transferred to the developing unit 3 such that the first resist film 133 on the initial wafer W is subject to the developing treatment. In the developing treatment, the soluble portion 133a of the first resist film 133 is dissolved and removed by using an alkali solution, for example, TMAH (TetraMethyl Ammonium Hydroxide) and the like, such that the insoluble portion 133b is left only as shown in FIG. 8D to thereby form the first resist pattern P1.

The initial wafer W on which the first resist pattern P1 has been formed is sequentially subject to treatments such as a post-bake treatment and the like according to a transfer order of the heating treatment unit 4→the cooling treatment unit. Thereafter, the initial wafer W on which the first resist pattern P1 has been formed is transferred to the transfer stage TRS5 of the second transfer rack unit TU2. As such, the first-time developing treatment is terminated.

Next, the second treatment process (Step S17 to Step S20) is performed on the initial wafer W.

The second coating treatment process (Step S17) is performed first on the initial wafer W. In the second coating treatment process (Step S17), a resist is applied on the initial wafer W to form a second resist film 135. FIGS. 8E to 8F show states of the initial wafer W in the second coating treatment process (Step S17).

In the second coating treatment process (Step S17), a second-time coating treatment is performed by a second coating treatment unit 13 of the second sub-block SB2. For example, the initial wafer W on the transfer stage TRS5 is transferred to the transfer stage TRS6 by the transfer arm D2, and then the main arm A6 of the C/S layer B6 receives the initial wafer W on the transfer stage TRS6. Thereafter, the initial wafer W is transferred in the order of the cleaning treatment unit (corresponding to the developing treatment unit 3 of FIG. 4)→the heating treatment unit→the cooling treatment unit→a cure treatment unit, such that a cleaning treatment and a surface treatment, e.g., a cure treatment by ultraviolet irradiation, are performed on a pattern which is formed by the first-time coating, exposing, and developing treatments. In this way, upon performing the second-time coating treatment, it may prevent particles from being attached and leaching from occurring. As shown in FIG. 8E, in the first resist pattern P1 on which the cure treatment was performed, a surface 134 has been subject to the cure treatment. And then, the initial wafer W is returned to the transfer stage TRS6.

Continuously, the initial wafer W of the transfer stage TRS6 is transferred to the transfer stage TRS7 of the second transfer rack unit TU2 by the transfer arm D2 such that the main arm A7 of the COT layer B7 receives the initial wafer W on the transfer stage TRS7. And then, the initial wafer W is sequentially subject to treatments according to a transfer order of the cooling treatment unit→the resist coating treatment unit (corresponding to the developing treatment unit 3 of FIG. 4)→the heating treatment unit. In this way, as shown in FIG. 8F, the second resist film 135 is formed on the initial wafer W on which the first resist pattern P1 has been formed. And then, the initial wafer W is transferred to the circumference exposing treatment unit, subject to the circumference exposing treatment, and then returned to the transfer stage TRS7.

An example of a resist, which is used for forming the second resist film 135, may be a chemically amplified resist that corresponds to an exposure treatment using an ArF excimer laser (having a wavelength of 193 nm) as a light source.

Also, a top anti-reflective coating (TARC) may be formed on top of the second resist film 135. In this case, the initial wafer W on the transfer stage TRS7 is transferred to the transfer stage TRS8 of the second transfer rack unit TU2 by the transfer arm D2, and then the main arm A8 of the TCT layer B8 receives the initial wafer W on the transfer stage TRS8. Subsequently, the initial wafer W is transferred in the order of the cooling treatment unit→the second anti-reflective coating forming unit (corresponding to the developing treatment unit 3 of FIG. 4)→the heating treatment unit, such that the top anti-reflective coating (TARC) is formed on top of the second resist film 135.

Afterwards, the initial wafer W is returned to the transfer stage TRS8. In this way, the second coating treatment is completed.

Next, the second exposing treatment process (Step S18) is performed on the initial wafer W. In the second exposing treatment process (Step S18), the initial wafer W on which the second resist film 135 has been formed is exposed. FIG. 8G shows a state of the initial wafer W in the second exposing treatment process (Step S18).

The initial wafer W on the transfer stage TRS8 is transferred to the transfer stage TRSC by the transfer arm D2. The shuttle arm 7 of the third transfer layer M3, which belongs to the second sub-block SB2, receives the initial wafer W on the transfer stage TRSC. And then, the shuttle arm 7 turns toward and moves to the third transfer rack unit TU3, thereby transferring the initial wafer W to the transfer stage TRSE of the third transfer rack unit TU3. The initial wafer W on the transfer stage TRSE is carried in the second carry-in buffer cassette ($Bu_{IN}2$) 93 of the buffer unit 9 by the carry-in interface arm E1 of the interface block S3.

When one lot of the wafers W are retained in the second carry-in buffer cassette ($Bu_{IN}2$) 93, one among one lot of the wafers W is transferred to the exposing apparatus 200 by the second-time exposing interface arm E4. And then, a second-time exposing treatment is performed on the wafer W which has been transferred to the exposing apparatus 200.

When the second-time exposing treatment is performed, as shown in FIG. 8G, a selected portion of the second resist film 135 is exposed by using a second reticle R2, and then a soluble portion 135a, which is selectively solubilized against a developing solution made of, for example, an alkali solvent, is generated. The soluble portion 135a is selectively generated such that the second resist pattern P2, which is made of the soluble portion 135a and an insoluble portion 135b that are soluble and insoluble against the developing solution, respectively, is obtained in the second resist film 135.

In this embodiment, the second resist pattern P2 is obtained by using the second reticle R2 having, for example, a pattern of which lines are arranged. As shown in FIG. 8G, a line width L2 and a space width SP2 of the second resist pattern P2 may be 32 nm and 32 nm, respectively.

And then, the initial wafer W for which the second-time exposing treatment has been completed is transferred to the interface block S3. For example, the initial wafer W is carried in the second carry-out buffer cassette ($Bu_{OUT}2$) 94 by the second-time exposing interface arm E4.

Thereafter, the second heating treatment process (Step S19) is performed on the initial wafer W. In the second heating treatment process (Step S19), the initial wafer W is subject to a heating treatment at the temperature T2. FIG. 8H shows a state of the initial wafer W in the second heating treatment process (Step S19).

The initial wafer W of the second carry-out buffer cassette ($Bu_{OUT}2$) 94 is carried in the treatment block S2 and then subject to the second-time developing treatment by the second developing treatment unit 12 of the first sub-block SB1. For example, the initial wafer W of the second carry-out buffer cassette ($Bu_{OUT}2$) 94 is taken out by the carry-out interface arm E2, and then transferred to the transfer stage TRSF that corresponds to the fourth transfer layer M4 of the third transfer rack unit TU3. Thereafter, the shuttle arm 7 of the fourth transfer layer M4 receives the initial wafer W on the transfer stage TRSF and turns its direction toward the second transfer rack unit TU2 to move thereto. And then, the shuttle arm 7 transfers the initial wafer W to the transfer stage TRSD of the second transfer rack unit TU2. The initial wafer W on the transfer stage TRSD is transferred to the transfer stage TRS5, which corresponds to one of the DEV layers B1 that belong to the second developing treatment unit 12 of the first sub-block SB1, by the transfer arm D2. Also, the main arm A1 of the DEV layer B1 receives the initial wafer W on the transfer stage TRS5, and then, in that DEV layer B1, the initial wafer W is transferred to the heating unit 4 included in the rack units U1 to U4 to be subject to the bake treatment after the exposing treatment.

In the heating treatment unit 4, the initial wafer W is carried in first from the transfer hole 42 to be mounted on the cooling plate 43 shown in FIG. 5. Continuously, the cooling plate 43 moves to move the initial wafer W to an upper portion of the hot plate 44. The initial wafer W is transferred from the cooling plate 43 to the elevating pin 48, thereby being mounted on the hot plate 44 by the elevating pin 48. As such, the heating treatment (e.g., the bake treatment after the exposing treatment) of the initial wafer W is started. After a predetermined time has passed, the initial wafer W is separated from the hot plate 44 by the elevating pin 48 such that the heating treatment of the initial wafer W is completed. Thereafter, the initial wafer W is cooled after being transferred from the elevating pin 48 to the cooling plate 43 and then transferred from the cooling plate 43 to a position outside of the heating treatment unit 4 through the transfer hole 42.

The second heating treatment process (Step S19) is performed such that a change from the insoluble portion 135b to the soluble portion 135a is promoted. Therefore, as shown in FIG. 8H, the line width L2 of the second pattern P2 is slightly reduced to become L2' and the space width SP2 of the second pattern P2 is slightly increased to become SP2'.

Next, the second developing treatment process (Step S20) is performed on the initial wafer W. In the second developing treatment process (Step S20), the initial wafer W for which the second heating treatment process (Step S19) has been performed is subject to a developing treatment, thereby forming the second resist pattern P2. FIG. 8I shows a state of the initial wafer W in the second developing treatment process (Step S20).

The initial wafer W for which the second heating treatment process (Step S19) has been completed is transferred to the developing treatment unit 3, and then the second resist film 135 on the initial wafer W is subject to the developing treatment. In the developing treatment, the soluble portion 135a of the second resist film 135 is removed by using an alkali solvent, for example, TMAH and the like, such that the insoluble portion 135b is left only as shown in FIG. 8I to form the second resist pattern P2.

The initial wafer W on which the second resist pattern P2 has been formed is subject to treatments according to a transfer order of the heating treatment unit 4→the cooling treatment unit. In this way, the initial wafer W on which the second resist pattern P2 has been formed is transferred to the transfer stage TRS1 of the first transfer rack unit TU1. Therefore, the second-time developing treatment is completed.

The initial wafer W for which the second-time developing treatment has been completed on the transfer stage TRS1 is received in the carrier 20 by the transfer arm C.

Thereafter, the line width measuring process (Step S21) is performed. In the line width measuring process (Step S21), a line width CD1 of the first resist pattern P1 and a line width CD2 of the second resist pattern P2, which are formed on the initial wafer W, are measured.

The initial wafer W that has been received in the carrier 20 is transferred to the line width measuring apparatus 110 by the transfer arm C. And then, a line width L1' of the first resist pattern P1, a space width SP1' of the first resist pattern P1, a line width L2' of the second resist pattern P2, and a space width SP2' of the second resist pattern P2, which are shown in FIG. 8I, are measured by using the line width measuring apparatus 110.

Also, in this embodiment, for convenience, the line width CD1 may imply the space width SP1' and the line width CD2 may imply the space width SP2'. Although the line width CD1 implies the line width L1' and the line width CD2 implies the line width L2', signs of sensitivities $ST_{11}$, $ST_{12}$, $ST_{21}$, and $ST_{22}$ are conversed in a plus or minus so that it may also be applicable to this embodiment.

Also, in the line width measuring process (Step S21), a representative point such as a center point in a surface of the initial wafer W may be measured, or a plurality of measurement points in the surface of the initial wafer W may be measured. In the first and second heating treatment processes (Steps S15 and S19), when the first and second temperatures T1 and T2 are controlled to temperatures at a representative point such as a center point in a surface of the initial wafer W, a line width measurement of the line width measuring process (Step S21) may be performed on the representative point. Further, in the first and second heating treatment processes (Steps S15 and S19), when the first and second temperatures T1 and T2 are independently controlled at a plurality of areas in a surface of the initial wafer W, a line width measurement of the line width measuring process (Step S21) may be performed on a plurality of corresponding measurement points.

Next, the first treatment process (Step S22 to Step S25) is performed on a subsequent wafer W.

The first coating treatment process (Step S22) is performed first on the subsequent wafer W. In the coating treatment process (Step S22), a resist is applied on the subsequent wafer W to form a first resist film 133. A state of the subsequent wafer W in the first coating treatment process (Step S22) is shown in FIG. 8A as well as the state of the initial wafer W in the first coating treatment process (Step S13). Also, specific formations of a bottom anti-reflective coating 132, a first resist film 133, and a top anti-reflective coating may be realized to be the same as those in the first coating treatment process (Step S13) with respect to the initial wafer W.

Thereafter, the first exposing treatment process (Step S23) is performed on the subsequent wafer W. In the first exposing treatment process (Step S23), the subsequent wafer W on which the first resist film 133 has been formed is exposed. A state of the subsequent wafer W in the first exposing treatment process (Step S23) is shown in FIG. 8B as well as the state of the initial wafer W in the first exposing treatment process (Step S14). Also, a specific exposing treatment may be performed in the same way as that in the first exposing treatment process (Step S14) with respect to the initial wafer W.

Thereafter, the first heating treatment process (Step S24) is performed on the subsequent wafer W. In the first heating treatment process (Step S24), the first temperature T1 is compensated based on the first data $ST_{12}$ and the measured value $CD_{c2}$ of the line width CD2 of the second resist pattern P2, and then the subsequent wafer W is subject to the heating treatment at the compensated first temperature T1. A state of the subsequent wafer W in the first heating treatment process (Step S24) is shown in FIG. 8C as well as the state of the initial wafer W in the first heating treatment process (Step S15).

An example of a compensation method will be described later in detail, but in brief, the first temperature T1 is compensated based on the first to fourth data $ST_{12}$, $ST_{21}$, $ST_{11}$, and $ST_{22}$, the measured values $CD_{c1}$ and $CD_{c2}$, and objective values $CD_{t1}$ and $CD_{t2}$ with respect to the space widths SP1' and SP2' of the first and second resist patterns P1 and P2. Also, the measured values $CD_{c1}$ and $CD_{c2}$ are values with respect to the line widths CD1 and CD2 of the first and second resist patterns P1 and P2 that are formed on the initial wafer W, respectively, and measured in the line width measuring process (Step S21). Further, a specific heating treatment may be performed in the same way as that in the first heating treatment process (Step S15) with respect to the initial wafer W.

The first heating treatment process (Step S24) is performed such that a change from the insoluble portion 133b to the soluble portion 133a is promoted. Therefore, as shown in FIG. 8C, the space width SP1 of the first resist pattern P1 is slightly increased to become SP1'.

Next, the first developing treatment process (Step S25) is performed on the subsequent wafer W. In the first developing treatment process (Step S25), the subsequent wafer W for which the first heating treatment process (Step S24) has been performed is subject to the developing treatment to form the first resist pattern P1. A state of the subsequent wafer W in the first developing treatment process (Step S25) is shown in FIG. 8D as well as the state of the initial wafer W in the first developing treatment process (Step S16). Also, a specific developing treatment may be performed in the same way as that in the first developing treatment process (Step S16) with respect to the initial wafer W.

Subsequently, the second treatment process (Step S26 to Step S29) is performed on the subsequent wafer W.

The second coating treatment process (Step S26) is performed first on the subsequent wafer W. In the second coating treatment process (Step S26), a resist is applied on the subsequent wafer W to form the second resist film 135. A state of the subsequent wafer W in the second coating treatment process (Step S26) is shown in FIGS. 8E and 8F as well as the state of the initial wafer W in the second coating treatment process (Step S17). Also, a specific formation of a second resist film 135 may be performed in the same way as that in the second coating treatment process (Step S17) with respect to the initial wafer W.

Next, the second exposing treatment process (Step S27) is performed on the subsequent wafer W. In the second exposing treatment process (Step S27), the subsequent wafer W on which the second resist film 135 has been formed is exposed. A state of the subsequent wafer W in the second exposing treatment process (Step S27) is shown in FIG. 8G as well as the state of the initial wafer E in the second exposing treatment process (Step S18). Also, a specific exposing treatment may be performed in the same way as that in the second exposing treatment process (Step S18) with respect to the initial wafer W.

Next, the second heating treatment process (Step S28) is performed on the subsequent wafer W. In the second heating treatment process (Step S28), the second temperature T2 is compensated based on the second data $ST_{21}$ and the measured value $CD_{c1}$ of the line width CD1 of the first resist pattern P1, and then the subsequent wafer W is subject to the heating treatment at the compensated temperature T2. A state of the subsequent wafer W in the second heating treatment process (Step S26) is shown in FIG. 8H as well as the state of the initial wafer W in the second heating treatment process (Step S19).

An example of a compensation method will be described later in detail, but in brief, the second temperature T2 is compensated based on the first to fourth data $ST_{12}$, $ST_{21}$, $ST_{11}$, and $ST_{22}$, the measured values $CD_{c1}$ and $CD_{c2}$, and the objective values $CD_{t1}$ and $CD_{t2}$ with respect to the space widths SP1' and SP2' of the first and second resist patterns P1 and P2. Also, the measured values $CD_{c1}$ and $CD_{c2}$ are values with respect to the line widths CD1 and CD2 of the first and second resist patterns P1 and P2 which are formed on the initial wafer W, respectively, and measured in the line width measuring process (Step S21). Further, a specific heating treatment may be performed in the same way as that in the second heating treatment process (Step S19) with respect to the initial wafer W.

The second heating treatment process (Step S28) is performed such that a change from the insoluble portion 135b to the soluble portion 135a is promoted. Therefore, as shown in FIG. 8H, the space width SP2 of the second resist pattern P2 is slightly increased to become SP2'.

However, the first temperature T1 has been compensated in the first heating treatment process (Step S24) whereas the second temperature T2 has been compensated in the second heating treatment process (Step S28). As a result, after the second heating treatment process (Step S28) has been performed, the space width SP1' (e.g., $CD_{c1}$) of the first resist pattern P1 is compensated to become a value close to the objective value $CD_{t1}$. Also, after the second heating treatment process (Step S28) has been performed, the space width SP2' (e.g., $CD_{c2}$) of the second resist pattern P2 is compensated to become a value close to the objective value $CD_{t2}$.

Thereafter, the second developing treatment process (Step S29) is performed on the subsequent wafer W. In the second developing treatment process (Step S29), the subsequent wafer W for which the second heating treatment process (Step S28) has been performed is subject to the developing treatment to form the second resist pattern P2. A state of the subsequent wafer W in the second developing treatment process (Step S29) is shown in FIG. 8I as well as the state of the initial wafer W in the second developing treatment process (Step S20). Also, a specific developing treatment may be performed in the same way as that in the second developing treatment process (Step S20) with respect to the initial wafer W.

Thereafter, the subsequent wafer W for which the second-time developing treatment has been completed is received as well as the initial wafer W in the carrier 20 by the transfer arm C.

Also, after the second-time developing treatment has been completed, the initial and subsequent wafers W for which the substrate treatment method according to this embodiment has been completed are subject to an etching treatment in an etching apparatus that is separately disposed with the substrate treatment system, such that the film 131 to be processed is etched as shown in FIG. 8J.

Next, the methods for compensating the first temperature T1 in the first heating treatment process (Step S24) and the second temperature T2 in the second heating treatment process (Step S28) will be described in detail.

After the first and second treatment processes have been performed on the initial wafer W, the space width SP1 of the first resist pattern P1 is slightly increased to become SP1' and the space width SP2 of the second resist pattern P2 is slightly increased to become SP2'.

In the first heating treatment process (Step S24), a chemical reaction of which the insoluble portion 133b is solubilized proceeds rapidly as the first temperature T1 becomes higher, such that the line width L1' of the first resist pattern P1 is reduced whereas the space width SP1' thereof is increased. That is, a relationship between the first temperature T1 and the space width SP1' (e.g., CD1) of the first resist pattern P1 may be represented as a linear relationship having a positive slope (e.g., a sensitivity) $ST_{11}$, as shown in FIG. 9A.

Also, in the second heating treatment process (Step S28), a chemical reaction of which the insoluble portion 135b is solubilized proceeds rapidly as the second temperature T2 becomes higher, such that the line width L2' of the second resist pattern P2 is reduced whereas the space width SP2' thereof is increased. That is, a relationship between the second temperature T2 and the space width SP2' (e.g., CD2) of the second resist pattern P2 may be represented as a linear relationship having a positive slope (e.g., a sensitivity) $ST_{22}$, as shown in FIG. 9D.

In addition, the space width SP2' of the second resist pattern P2 may be affected by the first temperature T1. That is, a relationship between the first temperature T1 and the space width SP2' (e.g., CD2) of the second resist pattern P2 may be represented as a linear relationship having a slope (e.g., a sensitivity) $ST_{12}$, as shown in FIG. 9B. This is the reason why the space width SP1' of the first resist pattern P1 is varied by the first temperature T1 so that a shape of the first resist pattern P1 is varied to thereby cause a change in the space width SP2' of the second resist pattern P2, which is formed after the shape variation of the first resist pattern P1.

Similarly, the space width SP1' of the first resist pattern P1 may be affected by the second temperature T2. That is, a relationship between the second temperature T1 and the space width SP1' (e.g., CD1) of the first resist pattern P1 may be represented as a linear relationship having a slope (e.g., a sensitivity) $ST_{21}$, as shown in FIG. 9C. This is the reason why the second heating treatment process is performed at the second temperature T2 so that the shape of the first resist pattern P1, which has been formed on the initial wafer W, is varied to thereby cause a change in the space width SP1' of the first resist pattern P1.

In FIG. 10, there are shown the sensitivity $ST_{11}$ (e.g., the third data), the sensitivity $ST_{12}$ (e.g., the first data), the sensitivity $ST_{21}$ (e.g., the second data), and the sensitivity $ST_{22}$ (e.g., the fourth data), which are obtained through the first and second data preparing processes. As shown in FIG. 10, $ST_{12}$ is standardized in terms of $ST_{11}$ whereas $ST_{21}$ is standardized in terms of $ST_{22}$. As such, the standardized sensitivities become $ST_{11}=1.00$, $ST_{12}=0.30$, $ST_{21}=0.68$, and $ST_{22}=1.00$ such that it can be seen that $ST_{12}$ and $ST_{21}$ are non-neglectable finite sensitivities in comparison with $ST_{11}$ and $ST_{22}$.

Therefore, the first temperature T1 is compensated based on the sensitivity $ST_{12}$ (e.g., the first data) as well as the sensitivity $ST_{11}$ (e.g., the third data) such that a line width of a resist pattern may be compensated with high accuracy. That is, the first temperature T1 is compensated based on the sensitivity $ST_{12}$ (e.g., the first data) and the measured value $CD_{c2}$ of the line width CD2 of the second resist pattern P2 on the initial wafer W such that a variation in the measured value of the line width of the resist pattern on the subsequent wafer W may be reduced.

Also, the second temperature T2 is compensated based on the sensitivity $ST_{21}$ (e.g., the second data) as well as the sensitivity $ST_{22}$ (e.g., the fourth data) such that a line width of a resist pattern may be compensated with high accuracy. That is, the second temperature T2 is compensated based on the sensitivity $ST_{21}$ (e.g., the second data) and the measured value $CD_{c1}$ of the line width CD1 of the first resist pattern P1 on the initial wafer W such that a variation in the measured value of the line width of the resist pattern on the subsequent wafer W may be reduced.

For example, this compensation may be accomplished by using the following equations. As shown in FIGS. 9A and 9C, the space width SP1' (e.g., CD1) of the first resist pattern P1 has the sensitivities $ST_{11}$ and $ST_{21}$ with respect to the first and second temperatures T1 and T2, respectively. Therefore, a relationship between the measured value $CD_{c1}$ and the objective value $CD_{t1}$ with respect to the line width CD1 of the first resist pattern P1 may be expressed as Equation 1.

$$CD_{t1}=CD_{c1}+ST_{11}(T_{t1}-T_{c1})+ST_{21}(T_{t2}-T_{c2}) \quad \text{(Equation 1)}$$

In Equation 1, $T_{c1}$ is a pre-compensation first temperature, $T_{t1}$ is a post-compensation first temperature, $T_{c1}$ is a pre-compensation second temperature, and $T_{t2}$ is a post-compensation second temperature.

Also, as shown in FIGS. 9B and 9D, the space width SP2' (e.g., CD2) of the second resist pattern P2 has the sensitivities $ST_{12}$ and $ST_{22}$ with respect to the first and second temperatures T1 and T2, respectively. Therefore, a relationship between the measured value $CD_{c2}$ and the objective value $CD_{t2}$ with respect to the line width CD2 of the second resist pattern P2 may be expressed as Equation 2.

$$CD_{t2}=CD_{c2}+ST_{12}(T_{t1}-T_{c1})+ST_{22}(T_{t2}-T_{c2}) \quad \text{(Equation 2)}$$

Through developing Equations 1 and 2, a relationship between the pre-compensation first temperature $T_{c1}$ and the post-compensation first temperature $T_a$ may be expressed as Equation 3.

$$T_{i1} = T_{c1} + \frac{\frac{CD_{t1} - CD_{c1}}{ST_{21}} - \frac{CD_{t2} - CD_{c2}}{ST_{22}}}{\frac{ST_{11}}{ST_{21}} - \frac{ST_{12}}{ST_{22}}} \quad \text{(Equation 3)}$$

Also, a relationship between the pre-compensation second temperature $T_{c2}$ and the post-compensation second temperature $T_{i2}$ may be expressed as Equation 4.

$$T_{i2} = T_{c2} + \frac{\frac{CD_{t1} - CD_{c1}}{ST_{11}} - \frac{CD_{t2} - CD_{c2}}{ST_{12}}}{\frac{ST_{21}}{ST_{11}} - \frac{ST_{22}}{ST_{12}}} \quad \text{(Equation 4)}$$

Therefore, the first and second temperatures T1 and T2 may be compensated based on the sensitivities $ST_{11}$, $ST_{12}$, $ST_{21}$, and $ST_{22}$, the measured values $CD_{c1}$ and $CD_{c2}$, and the objective values $CD_{t1}$ and $CD_{t2}$ with respect to the line widths.

As described with reference to FIGS. 9A to 10, the line width CD2 of the second resist pattern P2 depends upon the first temperature T1 whereas the line width CD1 of the first resist pattern P1 depends upon the second temperature T2. Therefore, a compensation with higher accuracy may be obtained in comparison with compensating the first temperature T1 based only on the sensitivity $ST_{11}$ of the line width CD1 with respect to the temperature T1 and the second temperature T2 based only on the sensitivity $ST_{22}$ of the line width CD2 with respect to the second temperature T2.

In accordance with the substrate treatment method of this embodiment, a first temperature is compensated based on the sensitivity of a line width of a second resist pattern with respect to the first temperature, whereas a second temperature is compensated based on the sensitivity of a line width of a first resist pattern with respect to the second temperature. In this way, a variation in line widths of first and second resist patterns between wafers may be reduced. Also, a variation in line widths of first and second resist patterns at each measuring point in a surface of a wafer may be reduced between the wafers such that a variation in line widths in the surfaces of the wafers may also be reduced.

Also, in this embodiment, as shown in FIGS. 8A to 8J, it is described that respective lines of the second resist pattern P2 are approximately in parallel with each other and arranged alternately therewith. However, this embodiment may also be applicable when the respective lines of the second resist pattern P2 are not in parallel with the respective lines of the resist pattern P1 and also intersected with the respective lines thereof as it is viewed in a plane. In this embodiment, at portions where the second resist pattern P2 and the respective lines of the first resist pattern P1 intersect with each other, the second resist pattern P2 is formed to cross over the respective lines of the first resist pattern P1. For this reason, the shapes of the first resist pattern P1 and the second resist pattern P2 influence each other such that the sensitivities $ST_{12}$ and $ST_{21}$ are increased to cause a line width to be easily varied. Therefore, according to this embodiment, there may be a great possibility of reducing a variation in line widths between wafers and in a surface of the wafer.

Embodiment 2

Next, with reference to FIGS. 11A to 14, a substrate treatment method according to Embodiment 2 will be described.

In the substrate treatment method according to this embodiment, there is a difference from the substrate treatment method according to Embodiment 1 where a dose amount of an exposing treatment in a first treatment process is compensated based on a measured value of a line width of a second resist pattern whereas a dose amount of an exposing treatment in a second treatment process is compensated based on a measured value of a line width of a first resist pattern.

A substrate treatment system for performing the substrate treatment method according to this embodiment may be the same as that in Embodiment 1.

Figure 11A:
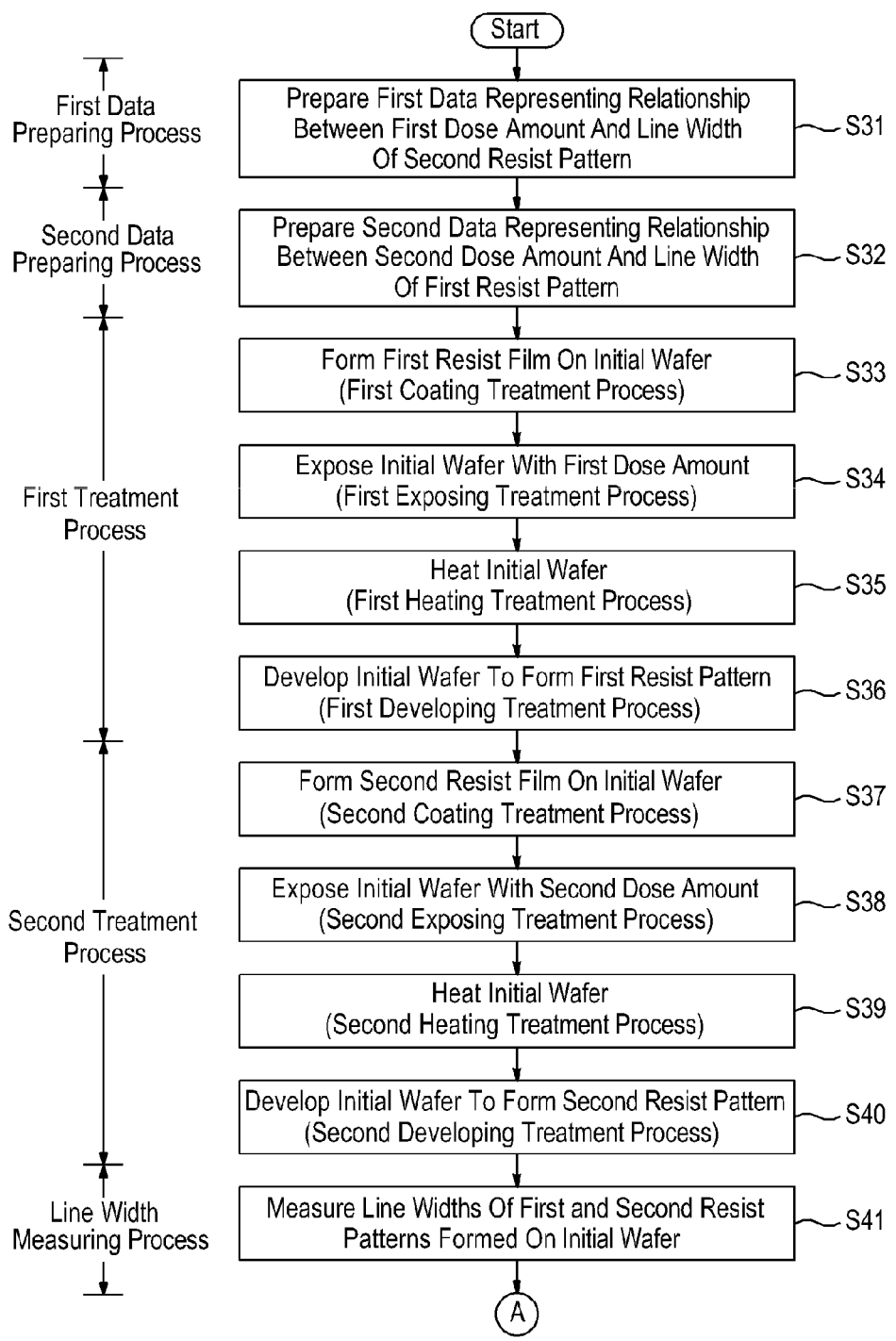

However, the substrate treatment method according to this embodiment is different from the substrate treatment method according to Embodiment 1. FIGS. 11A and 11B are flow charts showing respective processes of the substrate treatment method according to this embodiment. FIGS. 12A through 12J are sectional views showing states of a wafer in the respective processes of the substrate treatment method according to this embodiment. FIGS. 13A through 13D are graphs showing relationships between space widths of first and second resist patterns and first and second dose amounts. FIG. 14 is a graph showing the sensitivity of a space width with respect to temperature. Also, in the following description, parts corresponding to the above description may have the same reference numerals and the description thereof will be omitted.

As shown in FIGS. 11A and 11B, the substrate treatment method according to this embodiment includes a first data preparing process (Step S31), a second data preparing process (Step S32), a first treatment process (Step S33 to Step S36), a second treatment process (Step S37 to Step S40), a line width measuring process (Step S41), a first treatment process (Step S42 to Step S45), and a second treatment process (Step S46 to Step S49).

The first treatment process (Step S33 to Step S36) and the second treatment process (Step S37 to Step S40) perform a first treatment process and a second treatment process on an initial wafer W. The first treatment process (Step S33 to Step S36) includes a first coating treatment process (Step S33), a first exposing treatment process (Step S34), a first heating treatment process (Step S35), and a first developing treatment process (Step S36). The second treatment process (Step S37 to Step S40) includes a second coating treatment process (Step S37), a second exposing treatment process (Step S38), a second heating treatment process (Step S39), and a second developing treatment process (Step S40).

The first treatment process (Step S42 to Step S45) and the second treatment process (Step S46 to Step S49) perform a first treatment process and a second treatment process on a subsequent wafer W. The first treatment process (Step S42 to Step S45) includes a first coating treatment process (Step S42), a first exposing treatment process (Step S43), a first heating treatment process (Step S44), and a first developing treatment process (Step S45). The second treatment process (Step S46 to Step S49) includes a second coating treatment process (Step S46), a second exposing treatment process (Step S47), a second heating treatment process (Step S48), and a second developing treatment process (Step S49).

The first data preparing process (Step S31) is performed first. In the first data preparing process (Step S31), first data that represents a relationship between a first dose amount D1 and a space width SP2' of a second resist pattern P2 is prepared.

The first coating treatment process (Step S33) to be described later is performed on each wafer W of a wafer group consisting of a plurality of wafers W comprising the initial wafer and subsequent wafers and then the first exposing treatment process (Step S34) to be described later is performed with a first dose amount D1 changed on each wafer W. Thereafter, the first heating treatment process (Step S35) to the second developing treatment process (Step S40), which will be described later, are performed and then a first resist pattern P1 and a second resist pattern P2 are formed on the initial wafer W, as will be described later with reference to FIG. 12. Subsequently, the space width SP2' of the second resist pattern P2 as formed is measured by using the line width measuring apparatus 110. As such, the first data (corresponding to $SD_{12}$ to be described) is prepared, which represents a relationship between the first dose amount D1 and the space width SP2' of the second resist pattern P2.

Also, in a manner analogous to Embodiment 1, in the first data preparing process (Step S31), third data (corresponding to $ST_{11}$ to be described later) is prepared, which represents a relationship between the first dose amount D1 and a space width SP1' of the first resist pattern P1.

Afterwards, the second data preparing process (Step S32) is performed. In the second data preparing process (Step S32), second data is prepared, which represents a relationship between a second dose amount D2 and the space width SP1' of the first resist pattern P1.

The first coating treatment process (Step S33) to the second coating treatment process (Step S37), which will be described later, are performed on each wafer W of the wafer group consisting of the plurality of wafers W and then the second exposing treatment process (Step S38) to be described later is performed with the second dose amount D2 changed on each wafer W. Thereafter, the second heating treatment process (Step S39) and the second developing treatment process (Step S40) are performed, and then the first and second resist patterns P1 and P2 are formed on the initial wafer W, as will be described later with reference to FIG. 12. Subsequently, the space width SP1' of the first resist pattern P1 as formed is measured by using the line width measuring apparatus 110. In this way, the second data (corresponding to $SD_{21}$ to be described later) is prepared, which represents a relationship between the second dose amount D2 and the space width SP1' of the first resist pattern P1.

Also, in the second data preparing process (Step S32), fourth data (corresponding to $ST_{22}$ to be described later) is prepared, which represents a relationship between the second dose amount D2 and the space width SP2' of the second resist pattern P2.

Next, the first treatment process (Step S33 to Step S36) is performed on the initial wafer W of the wafer group.

Figure 12A:
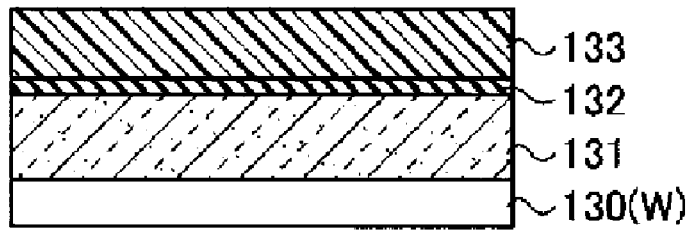
FIGS. 12A to 12J are sectional views showing states of a wafer in respective processes of a substrate treatment method in accordance with Embodiment 2 of the present disclosure.

The coating treatment process (Step S33) is performed first on the initial wafer W. The first coating treatment process (Step S33) is the same as the first coating treatment process (Step S13) in Embodiment 1. A state of the initial wafer W in the first coating treatment process (Step S33) is shown in FIG. 12A. FIG. 12A is the same as FIG. 8A.

Figure 12B:
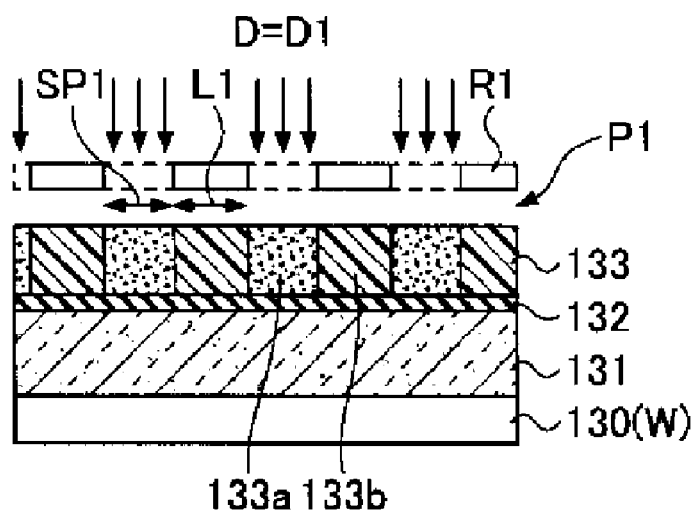
Figure 12C:
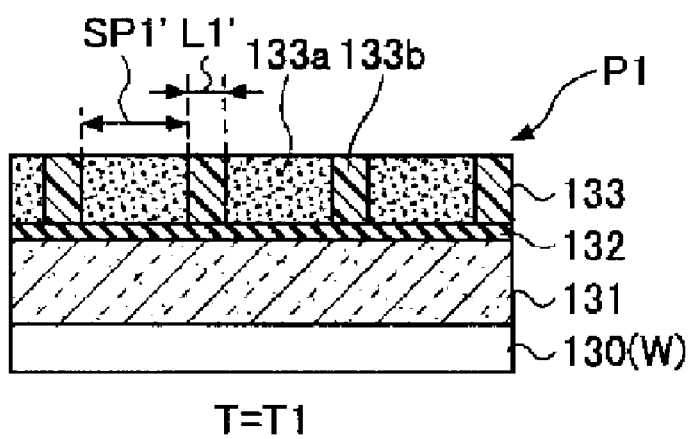
Figure 12D:
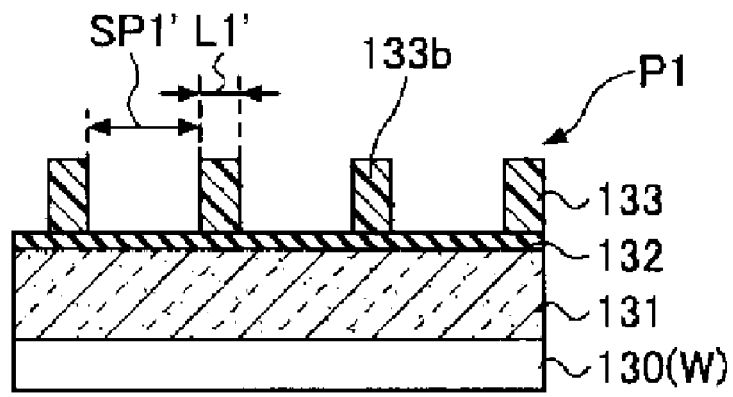
Figure 12E:
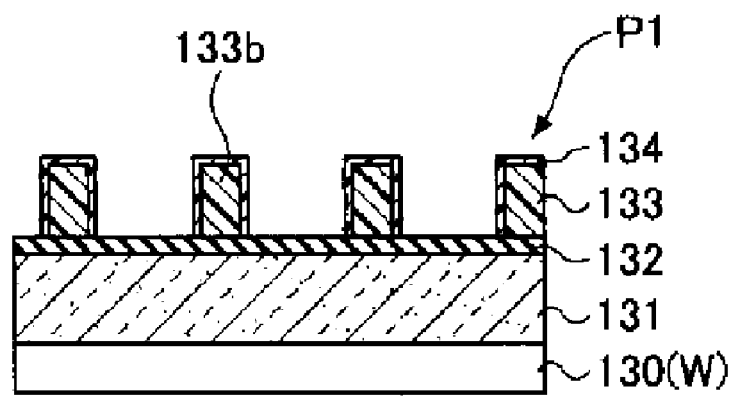
Figure 12F:
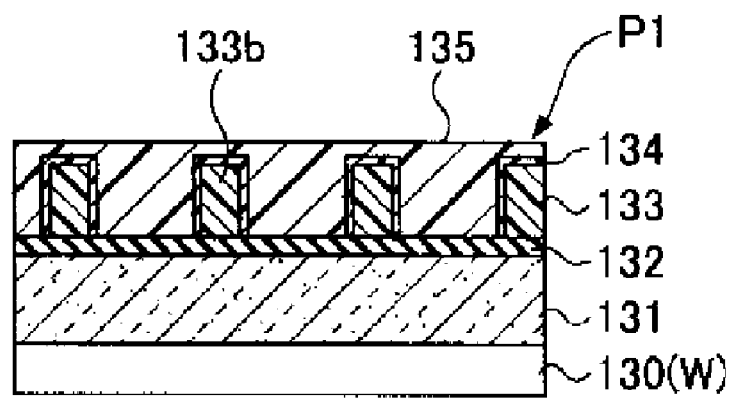

Thereafter, the first exposing treatment process (Step S34) is performed on the initial wafer W. In the first exposing treatment process (Step S34), the initial wafer W on which a first resist film 133 has been formed is exposed to the first dose amount D1. FIG. 12B shows a state of the initial wafer W in the first exposing treatment process (Step S34). FIG. 12B is the same as FIG. 8B.

In a manner analogous to the first exposing treatment process (Step S14) of Embodiment 1, a first-time exposing treatment is performed on the initial wafer W which has been transferred to the exposing apparatus 200. When the first-time exposing treatment is performed, as shown in FIG. 12B, a first resist film 133 is exposed to a dose amount D such as the first dose amount D1, thereby obtaining the first resist pattern P1 which is made of a soluble portion 133a and an insoluble portion 133b. Thereafter, the initial wafer W for which the first-time exposing treatment has been completed is carried in the interface block S3, as described in Embodiment 1.

Subsequently, the first heating treatment process (Step S35) to the second coating treatment process (Step S37) are performed on the initial wafer W such that a first resist pattern P1 is formed and then a second resist film 135 is formed on the first resist pattern P1. The first heating treatment process (Step S35) to the second coating treatment process (Step S37) are the same as the first heating treatment process (Step S15) to the second coating treatment process (Step S17) in Embodiment 1, respectively. States of the initial wafer W in the first heating treatment process (Step S35) to the second coating treatment process (Step S37) are shown in FIGS. 12C to 12F, respectively. FIGS. 12C to 12F are the same as FIGS. 8C to 8I, respectively.

Figure 12G:
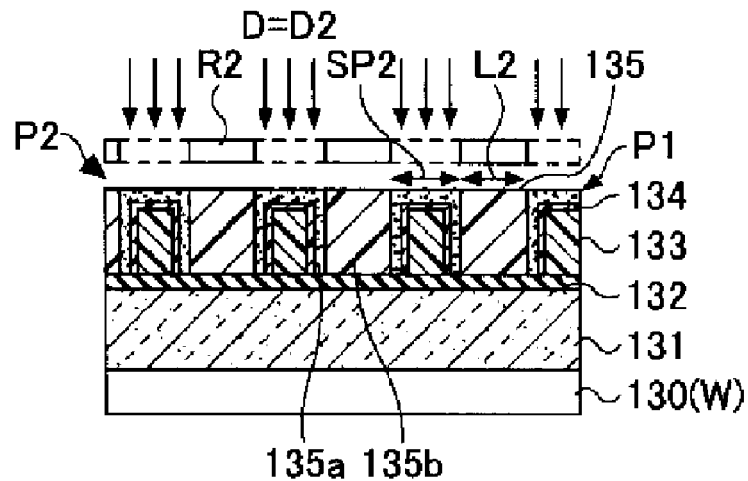

Next, the second exposing treatment process (Step S38) is performed on the initial wafer W. In the second exposing treatment process (Step S38), the initial wafer W on which the second resist film 135 has been formed is exposed to a second dose amount D2. FIG. 12G shows a state of the initial wafer W in the second exposing treatment process (Step S38).

In a manner analogous to the second exposing treatment process (Step S18) of Embodiment 1, a second-time exposing treatment is performed on the initial wafer W which has been transferred to the exposing apparatus 200. When the second-time exposing treatment is performed, as shown in FIG. 12G, the second resist film 135 is exposed to a dose amount such as the second dose amount D2, thereby obtaining the second resist pattern P2 which is made of a soluble portion 135a and an insoluble portion 135b. Thereafter, the initial wafer W for which the second-time exposing treatment has been completed is carried in the carry-out buffer cassette ($Bu_{OUT}2$) 94, as described in Embodiment 1.

Figure 12H:
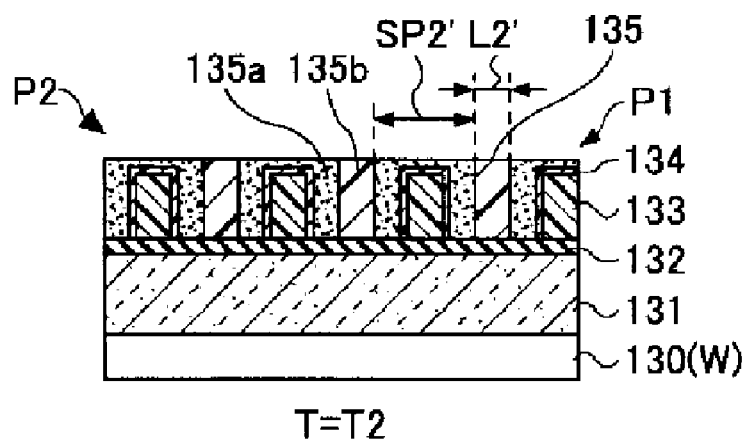
Figure 12I:
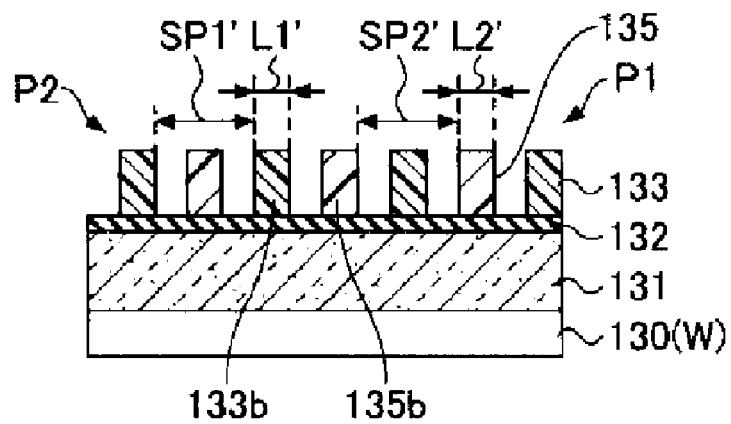

Subsequently, the second heating treatment process (Step S39) and the second developing treatment process (Step S40) are performed on the initial wafer W so as to form the second resist pattern P2. The second heating treatment process (Step S39) and the second developing treatment process (Step S40) are the same as the second heating treatment process (Step S19) and the second developing treatment process (Step S20) in Embodiment 1, respectively. Also, states of the initial wafer W in the second heating treatment process (Step S39) and the second developing treatment process (Step S40) are shown in FIGS. 12H and 12I, respectively. FIGS. 12H and 12I are the same as FIGS. 8H and 8I, respectively.

Continuously, the line width measuring process (Step S41) is performed. The line width measuring process (Step S41) is the same as the line width measuring process (Step S21) in Embodiment 1.

Next, the first treatment process (Step S42 to Step S45) is performed on a subsequent wafer W.

The first coating treatment process (Step S42) is performed first on the subsequent wafer W. The first coating treatment process (Step S42) is the same as the first coating treatment process (Step S22) in Embodiment 1. A state of the subsequent wafer W in the first coating treatment process (Step S42) is shown in FIG. 12A.

Subsequently, the first exposing treatment process (Step S43) is performed on the subsequent wafer W. In the first exposing treatment process (Step S43), the first dose amount D1 is compensated based on the first data $SD_{12}$ and a measured value $CD_{c2}$ of a line width CD2 of the second resist pattern P2, and then the subsequent wafer W is exposed to the compensated first dose amount D1. FIG. 12B shows a state of the subsequent wafer W in the first exposing process (Step S43).

In a manner analogous to the first exposing treatment process (Step S23) of Embodiment 1, a first-time exposing treatment is performed on the subsequent wafer W which has been transferred to the exposing apparatus 200. When the first-time exposing treatment is performed, as shown in FIG. 12B, the first resist film 133 is exposed to the compensated first dose amount D1, thereby obtaining the first resist pattern P1 which is made of a soluble portion 133a and an insoluble portion 133b. Thereafter, the subsequent wafer W for which the first-time exposing treatment has been completed is carried in the interface block S3, as described in Embodiment 1.

Afterwards, the first heating treatment process (Step S44) and the second coating treatment process (Step S46) are performed on the subsequent wafer W such that the first resist pattern P1 is formed and then the second resist film 135 is formed on the first resist pattern P1. The first heating treatment process (Step S44) to the second coating treatment process (Step S46) are the same as the first heating treatment process (Step S24) to the second coating treatment process (Step S26) in Embodiment 1, respectively. Also, states of the subsequent wafer W in the first heating treatment process (Step S44) to the second coating treatment process (Step S46) are shown in FIGS. 12C to 12F, respectively.

Thereafter, the second exposing treatment process (Step S47) is performed on the subsequent wafer W. In the second exposing treatment process (Step S47), the second dose amount D2 is compensated based on the second data $SD_{21}$ and a measured value $CD_{c1}$ of a line width CD1 of the first resist pattern P1 and then the subsequent wafer W is exposed to the compensated second dose amount D2. FIG. 12G shows a state of the subsequent wafer W in the second exposing treatment process (Step S47).

In a manner analogous to the second exposing treatment process (Step S27) in Embodiment 1, a second-time exposing treatment is performed on the subsequent wafer W which has been transferred to the exposing apparatus 200. When the second-time exposing treatment is performed, as shown in FIG. 12G, the second resist film 135 is exposed to the compensated second dose amount D2, thereby obtaining the second resist pattern P2 which is made of a soluble portion 135a and an insoluble portion 135b. Thereafter, the subsequent wafer W for which the second-time exposing treatment has been completed is carried in the second carry-out buffer cassette ($Bu_{OUT}2$) 94, as described in Embodiment 1.

Next, the second heating treatment process (Step S48) and the second developing treatment process (Step S49) are performed on the subsequent wafer W such that the second resist pattern P2 is formed. The second heating treatment process (Step S48) and the second developing treatment process (Step S49) are the same as the second heating treatment process (Step S28) and the second developing treatment process (Step S29), respectively. Also, states of the subsequent wafer W in the second heating treatment process (Step S48) and the second developing treatment process (Step S49) are shown in FIGS. 12H and 12I, respectively.

Figure 12J:
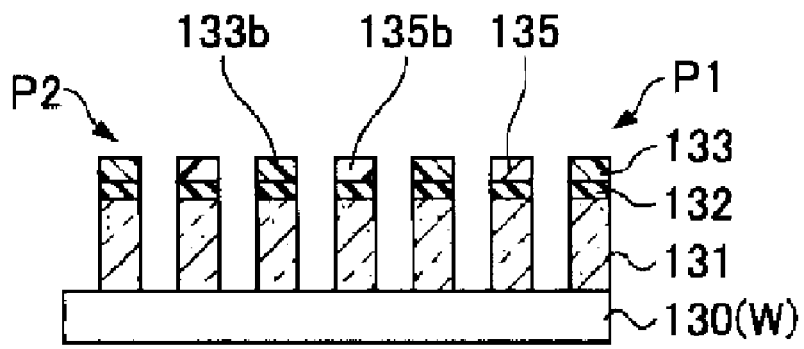

In a manner analogous to Embodiment 1, the subsequent wafer W for which the second-time developing treatment has been completed is received in the carrier 20 by the transfer arm C, in the same way as done for the initial wafer W. Also, after the second-time developing treatment has been completed, the subsequent wafer W for which the substrate treatment method according to this embodiment has been completed may be subject to an etching treatment with respect to a film 131 to be processed in an etching apparatus that is separately disposed with the substrate treatment system, as shown in FIG. 12J.

Next, methods of compensating the first dose amount D1 in the first exposing treatment process (Step S43) and the second dose amount D2 in the second exposing treatment process (Step S47) will be described in detail.

Figure 13A:
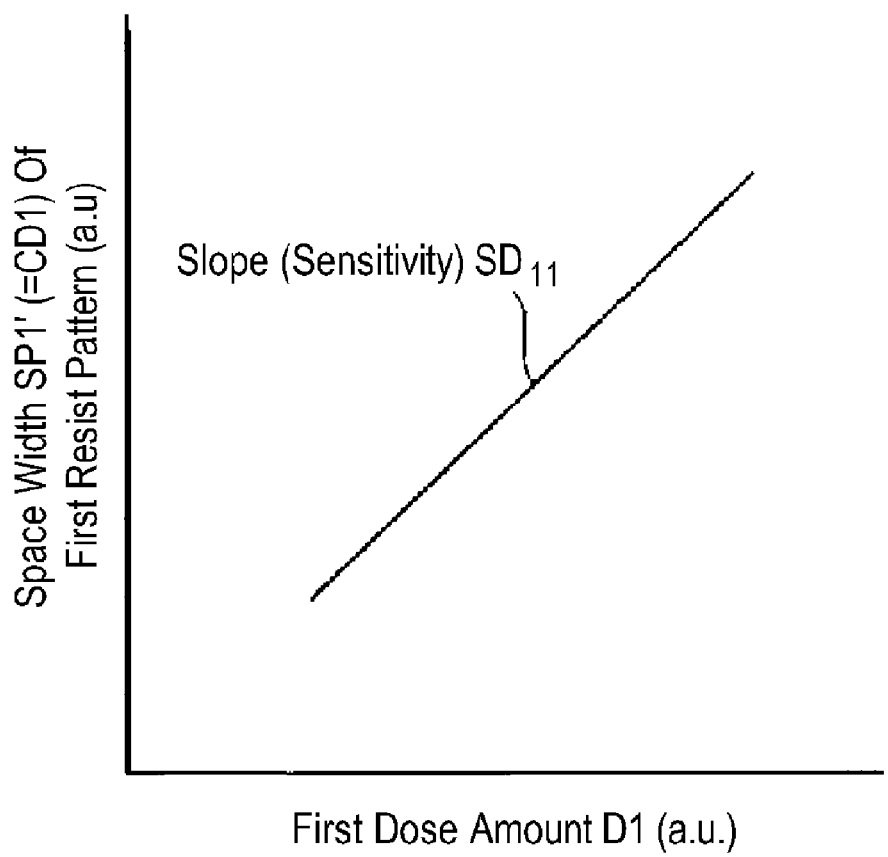
FIGS. 13A to 13D are graphs showing relationships between space widths of first and second resist patterns and first and second dose amounts.
Figure 13D:
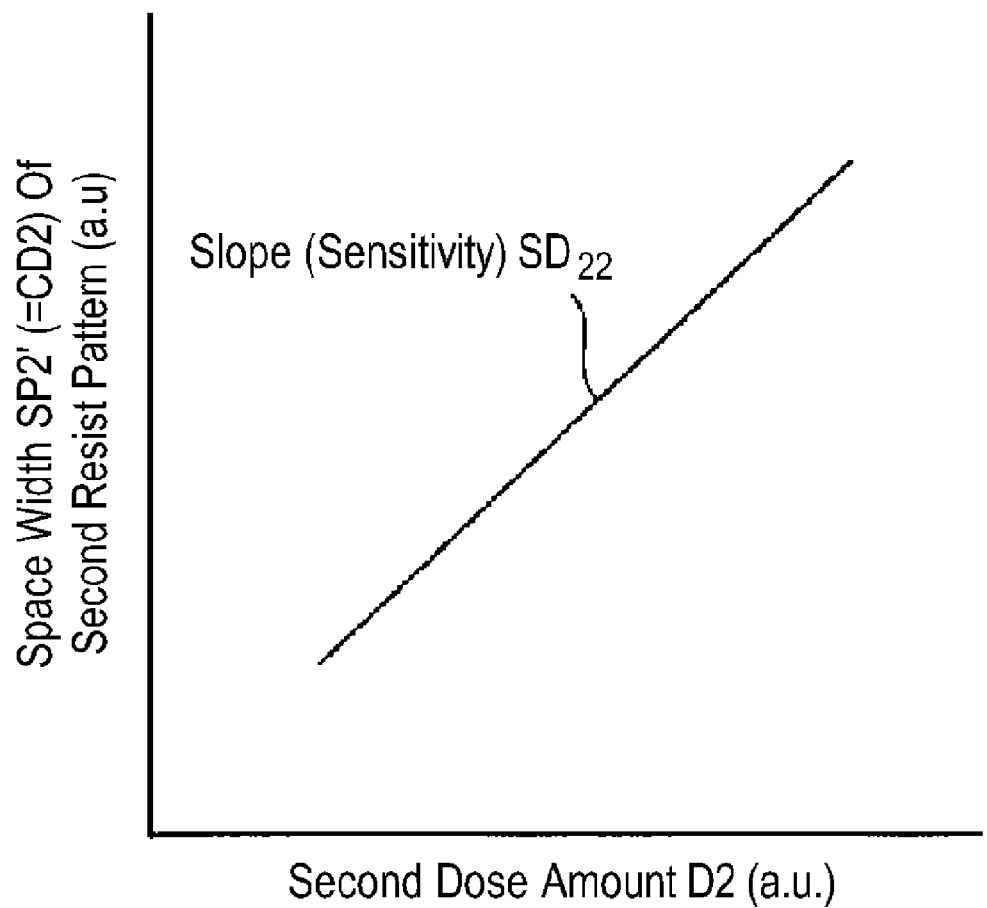
Figure 14:
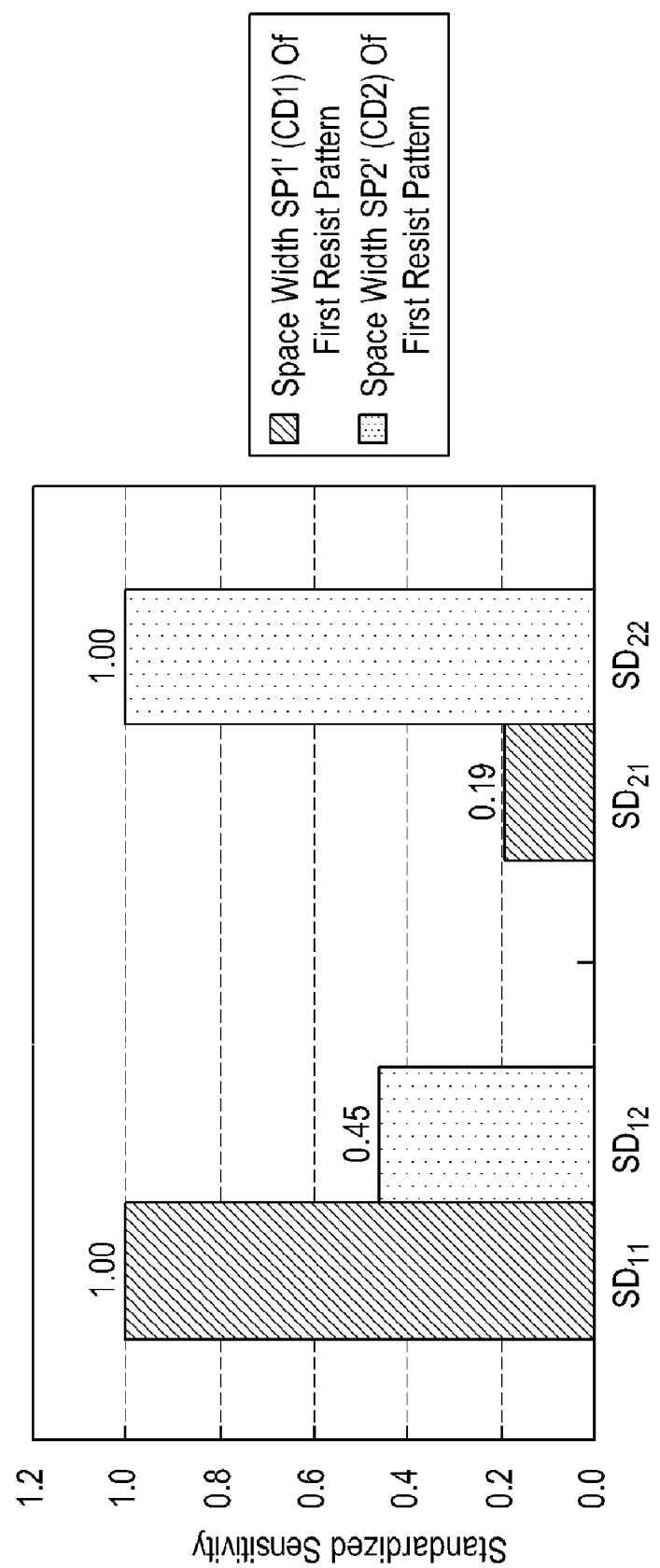
FIG. 14 is a graph showing the sensitivity of a space width with respect to a dose amount.

A relationship between the first dose amount D1 and the space width SP1' (e.g., CD1) of the first resist pattern P1 may be a linear relationship of a positive slope (e.g., a sensitivity) $SD_{11}$, as shown in FIG. 13A. Also, a relationship between the second dose amount D2 and the space width SP2' (e.g., CD2) of the second resist pattern P2 may be a linear relationship of a positive slope (e.g., a sensitivity) $SD_{22}$, as shown in FIG. 13D.

Figure 13B:
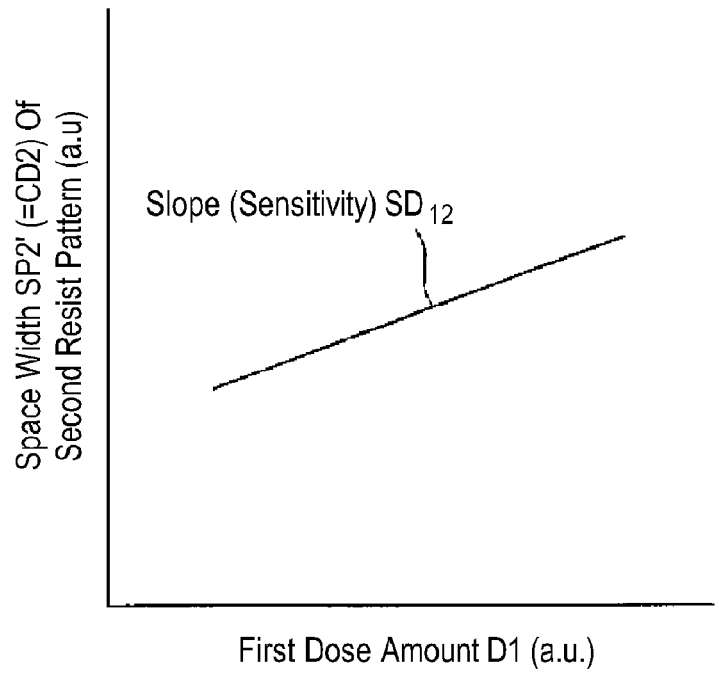

Meanwhile, a relationship between the first dose amount D1 and the space width SP2' (e.g., CD2) of the second resist pattern P2 may be a linear relationship of a slope (e.g., a sensitivity) $SD_{12}$, as shown in FIG. 13B. This is the reason why the space width SP1' of the first resist pattern P1 is changed by the first dose amount D1 such that a shape of the first resist pattern P1 is varied to thereby cause a change in the space width SP2' of the second resist pattern P2, which is formed after the formation of the first resist pattern P1.

Figure 13C:
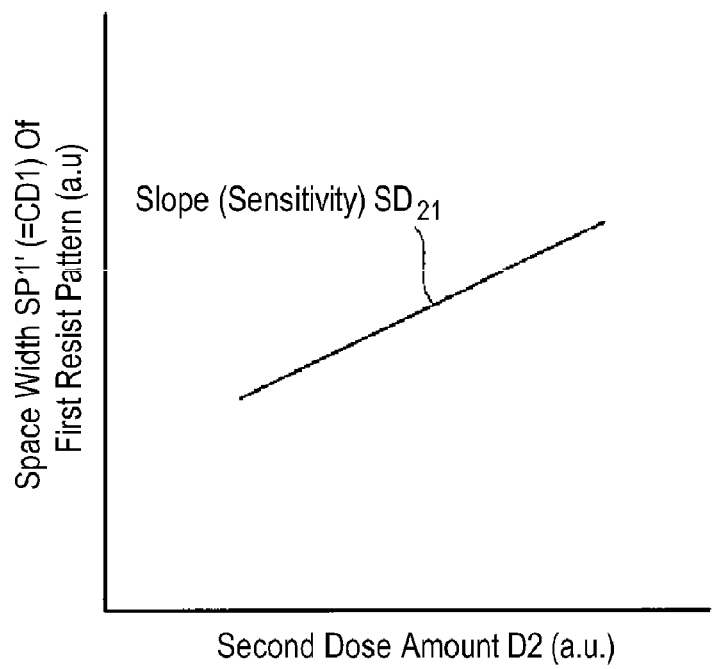

Similarly, a relationship between the second dose amount D2 and the space width SP1' (e.g., CD1) of the first resist pattern P1 may be a linear relationship of a slope (e.g., a sensitivity) $SD_{21}$, as shown in FIG. 13C. This is the reason why the second exposing treatment process is performed with the second dose amount D2 such that a shape of the first resist pattern P1, which has been formed on the subsequent wafer W, is varied to thereby cause a change in the space width SP1' of the first resist pattern P1.

FIG. 14 shows a graph representing a sensitivity $SD_{141}$ (e.g., third data), a sensitivity $SD_{12}$ (e.g., first data), a sensitivity $SD_{21}$ (e.g., second data), and a sensitivity $SD_{22}$ (fourth data), which are obtained through the first and second data preparing processes. In FIG. 14, $SD_{12}$ is standardized in terms of $SD_{11}$ whereas $SD_{21}$ is standardized in terms of $SD_{22}$. As such, the standardized sensitivities become $SD_{11}=1.00$, $SD_{12}=0.45$, $SD_{21}=0.19$, and $SD_{22}=1.00$ such that it can be seen that $ST_{12}$ and $ST_{21}$ are non-neglectable finite sensitivities in comparison with $ST_{11}$ and $ST_{22}$.

Therefore, the first dose amount D1 is compensated based on the sensitivity $SD_{12}$ (e.g., the first data) as well as the sensitivity $SD_{11}$ (e.g., the third data) such that it may realize the decrease of a variation in the measured values of the line widths of the resist patterns of the subsequent wafer W. Also, the second dose amount D2 is compensated based on the sensitivity $SD_{21}$ (e.g., the second data) as well as the sensitivity $SD_{22}$ (e.g., the fourth data) such that it may realize the decrease of a variation in the measured values of the line widths of the resist patterns of the subsequent wafer W.

Also, in a manner analogous to Embodiment 1, the compensation of the dose amounts may be performed by using the following equations. As shown in FIGS. 13A and 13C, the space width SP1' (e.g., CD1) of the first resist pattern P1 has the sensitivities $SD_{11}$ and $SD_{21}$ with respect to the first dose amount D1 and the second dose amount D2, respectively. Therefore, a relationship between a measured value $CD_{c1}$ and an objective value $CD_{t1}$ of the line width of the first resist pattern P1 is expressed as Equation 5.

$$CD_{t1} = CD_{c1} + SD_{11}(D_{i1} - D_{c1}) + SD_{22}(D_{i2} - D_{c2}) \quad \text{(Equation 5)}$$

In Equation 5, $D_{c1}$ is a pre-compensation first dose amount, $D_{i1}$ is a post-compensation first dose amount, $D_{c2}$ is a pre-compensation second dose amount, and $D_{i2}$ is a post-compensation second dose amount.

Also, as shown in FIGS. 13B and 13D, the space width SP2' (e.g., CD2) of the second resist pattern P2 has the sensitivities $SD_{12}$ and $SD_{22}$ with respect to the first dose amount D1 and the second dose amount D2, respectively. Therefore, a relationship between a measured value $CD_{c2}$ and an objective value $CD_{t2}$ of the line width CD2 of the second resist pattern P2 is expressed as Equation 6.

$$CD_{t2} = CD_{c2} + SD_{12}(D_{i1} - D_{c1}) + SD_{22}(D_{i2} - D_{c2}) \quad \text{(Equation 6)}$$

Through developing Equations 5 and 6, a relationship between the pre-compensation first dose amount $D_{c1}$ and the post-compensation first dose amount $D_{i1}$ may be expressed as Equation 7.

$$D_{i1} = D_{c1} + \frac{\dfrac{CD_{t1} - CD_{c1}}{SD_{21}} - \dfrac{CD_{t2} - CD_{c2}}{SD_{22}}}{\dfrac{SD_{11}}{SD_{21}} - \dfrac{SD_{12}}{SD_{22}}} \quad \text{(Equation 7)}$$

Also, a relationship between the pre-compensation second dose amount $D_{c2}$ and the post-compensation second dose amount $D_{i1}$ is expressed as Equation 8.

$$D_{i2} = D_{c2} + \frac{\dfrac{CD_{t1} - CD_{c1}}{SD_{11}} - \dfrac{CD_{t2} - CD_{c2}}{SD_{12}}}{\dfrac{SD_{21}}{SD_{11}} - \dfrac{SD_{22}}{SD_{12}}} \quad \text{(Equation 8)}$$

Therefore, the first dose amount D1 and the second dose amount D2 may be compensated based on the sensitivities $SD_{11}$, $SD_{12}$, $SD_{21}$, and $SD_{22}$, the measured values $CD_{c1}$ and $CD_{c2}$ of the line widths, and the objective values $CD_{t1}$ and $CD_{t2}$.

Also, in the exposing apparatus, a dose amount D may be determined depending upon process conditions such as an output of an exposing source, an exposure time and the like. Therefore, in this embodiment, an output of an exposing source or an exposure time may be compensated instead of the dose amount D. Alternatively, in some embodiments, it may be used as exposure process conditions such as an exposure temperature, a distance between a light source and a wafer, and a liquid concentration upon performing a liquid immersion lithography.

As described with reference to FIGS. 13 and 14, the line width CD2 of the second resist pattern P2 depends upon the first dose amount D1 whereas the line width CD1 of the first resist pattern P1 depends upon the second dose amount D2. Therefore, the compensation may be obtained with higher accuracy in comparison with compensating the first dose amount D1 based only on the sensitivity $SD_{11}$ of the line width CD1 with respect to the first dose amount D1 and the second dose amount D2 based only on the sensitivity $SD_{22}$ of the line width CD2 with respect to the second dose amount D2.

As described above, in accordance with the substrate treatment method of this embodiment, a first dose amount is compensated based on the sensitivity of the line width of the second resist pattern with respect to the first dose amount whereas a second dose amount is compensated based on the sensitivity of the line width of the first resist pattern with respect to the second does amount. In this way, a variation in the line widths of the first and second resist patterns between wafers may be reduced. Also, at respective measurement points in a surface of the wafer, a variation in the line widths of the first and second patterns may be reduced between the wafers such that a variation in the line widths in the surfaces of the wafers is also reduced.

Moreover, in this embodiment, as shown in FIG. 12, it is described that the respective lines of the second resist pattern P2 are approximately in parallel with the respective lines of the first resist pattern P1 and arranged alternately with the respective lines thereof. However, in some embodiments, the respective lines of the second resist pattern P2 may not be in parallel with the respective lines of the first resist pattern P1 and intersect with the respective lines thereof. In this embodiment, on portions at which the second resist pattern P2 and the respective lines of the first resist pattern P1 intersect with each other, the second resist pattern P2 is formed to cross over the respective lines of the first resist pattern P1. Thus, a shape of the first resist pattern P1 and a shape of the second resist pattern P2 influence each other such that the sensitivities $SD_{12}$ and $SD_{21}$ are increased to cause the line widths to be easily varied. As a result, in accordance with this embodiment, it may dramatically reduce a variation in line widths between wafers and in surfaces of the wafers.

While certain embodiments have been described, these embodiments have been presented by way of example only, and are not intended to limit the scope of the inventions. Indeed, the novel method described herein may be embodied in a variety of other forms; furthermore, various omissions, substitutions and changes in the form of the embodiments described herein may be made without departing from the spirit of the inventions.

Also, in accordance with Embodiment 1, there are described examples in which the heating temperature of the heating treatment in the first treatment process is compensated based on the measured value of the line width of the second resist pattern whereas the heating temperature of the heating treatment in the second treatment process is compensated based on the measured value of the line width of the first resist pattern. Further, in accordance with Embodiment 2, there are described examples in which the dose amount in the exposing treatment of the first treatment process is compensated based on the measured value of the line width of the second resist pattern whereas the dose amount in the exposing treatment of the second treatment process is compensated based on the measured value of the line width of the first resist pattern.

However, in some embodiments, one of the treatment conditions in the first treatment process may be compensated based on the measured value of the line width of the second resist pattern whereas one of the treatment conditions in the second treatment process may be compensated based on the measured value of the line width of the first resist pattern. That is, in some embodiments, a first treatment condition in the first treatment process may be compensated based on the measured value of the line width of the second resist pattern whereas a second treatment condition in the second treatment process may be compensated based on the measured value of the line width of the first resist pattern.

In some embodiments, a condition (e.g., a first treatment condition or a second treatment condition) may include a heating time of the heating treatment, a post-exposure delay (PED) time after the exposing treatment has been completed before the heating treatment is initiated, a heat treatment atmosphere, a wafer temperature in the coating or developing treatment, the number of revolutions of a wafer, a supply speed of a resist or a developing solution, or the like.

Moreover, in some embodiments, the substrate treatment method according to the present disclosure may be applicable to an apparatus which includes a process of treating a semiconductor substrate, a glass substrate and the like.

What is claimed is:

1. A method of treating a substrate, the method comprising:
    a first treatment process for exposing an initial substrate on which a first resist film is formed, heating the exposed initial substrate, and developing the heated initial substrate, thereby forming a first resist pattern; and
    a second treatment process for forming a second resist film on the initial substrate on which the first resist pattern is formed, exposing the initial substrate on which the second resist film is formed, heating the exposed initial substrate, and developing the heated initial substrate, thereby forming a second resist pattern,
    wherein, after the second treatment process is performed on the initial substrate, a line width of the second resist pattern formed on the initial substrate is measured, a first treatment condition in the first treatment process is compensated based on a measured value of the line width of the second resist pattern, the first treatment process is performed on one of subsequent substrates in compliance with the compensated first treatment condition, a line width of the first resist pattern formed on the initial substrate is measured, a second treatment condition in the second treatment process is compensated based on a measured value of the line width of the first resist pattern, and the second treatment process is performed on the subsequent substrate in compliance with the compensated second treatment condition.

2. The method of claim 1, wherein the first treatment process is to heat up the exposed initial substrate at a first temperature, the second treatment process is to heat up the exposed initial substrate at a second temperature, and
    wherein, after the second treatment process is performed on the initial substrate, the first temperature is compensated based on the measured value of the line width of the second resist pattern, the subsequent substrate is heated up at the compensated first temperature, the second temperature is compensated based on the measured value of the line width of the first resist pattern, and the subsequent substrate is heated up at the compensated second temperature.

3. The method of claim 2, further comprising:
    a first data preparing process for preparing first data that represents a relationship between the first temperature and the line width of the second resist pattern; and
    a second data preparing process for preparing second data that represents a relationship between the second temperature and the line width of the first resist pattern,
    wherein, after the second treatment process is performed on the initial substrate, the first temperature is compensated based on the first data and the measured value of the line width of the second resist pattern, and the second temperature is compensated based on the second data and the measured value of the line width of the first resist pattern.

4. The method of claim 3, wherein the first data preparing process prepares the first data by performing the first treatment process with the first temperature changed on each substrate of a first substrate group comprising the initial substrate and subsequent substrates, performing the second treatment process on each substrate of the first substrate group on which the first treatment process is performed, and then, measuring the line width of the second resist pattern formed on each substrate of the first substrate group, and
    wherein the second data preparing process prepares the second data by performing the first treatment process on each substrate of a second substrate group comprising the initial substrate and subsequent wafers which are subject to the first data preparing process, performing the second treatment process with the second temperature changed on each substrate of the second substrate group on which the first treatment process is performed, and then, measuring the line width of the first resist pattern formed on each substrate of the second substrate group.

5. The method of claim 1, wherein the first treatment process is to expose the initial substrate with a first dose amount and the second treatment process is to expose the initial substrate with a second dose amount,
    wherein, after the second treatment process is performed on the initial substrate, the first dose amount is compensated based on the measured value of the line width of the second resist pattern, the subsequent substrate is exposed with the compensated first dose amount, the second dose amount is compensated based on the measured value of the line width of the first resist pattern, and the subsequent substrate is exposed with the compensated second dose amount.

6. The method of claim 5, further comprising:
    a first data preparing process for preparing first data that represents a relationship between the first dose amount and the line width of the second resist pattern; and
    a second data preparing process for preparing second data that represents a relationship between the second dose amount and the line width of the first resist pattern,
    wherein, after the second treatment process is performed on the initial substrate, the first dose amount is compensated based on the first data and the measured value of the line width of the second resist pattern, and the second dose amount is compensated based on the second data and the measured value of the line width of the first resist pattern.

7. The method of claim 6, wherein the first data preparing process prepares the first data by performing the first treatment process with the first dose amount changed on each substrate of a first substrate group comprising the initial substrate and subsequent substrates, performing the second treatment process on each substrate of the first substrate group on which the first treatment process is performed, and then, measuring the line width of the second resist pattern formed on each substrate of the first substrate group, and
    wherein the second data preparing process prepares the second data by performing the first treatment process on each substrate of a second substrate group comprising the initial substrate and subsequent substrates which are subject to the first data preparing process, performing the second treatment process with the second dose amount changed on each substrate of the second substrate group on which the first treatment process is performed, and then, measuring the line width of the first resist pattern formed on each substrate of the second substrate group.

* * * * *